(12) United States Patent
Yang et al.

(10) Patent No.: US 12,340,987 B2
(45) Date of Patent: Jun. 24, 2025

(54) TUNABLE PLASMA EXCLUSION ZONE IN SEMICONDUCTOR FABRICATION

(71) Applicant: TAIWAN SEMICONDUCTOR MANUFACTURING COMPANY LIMITED, Hsin-Chu (TW)

(72) Inventors: Che Wei Yang, New Taipei (TW);
Chih Cheng Shih, Kaohsiung (TW);
Sheng-Chan Li, Tainan (TW);
Cheng-Yuan Tsai, Chu-Pei (TW);
Sheng-Chau Chen, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 305 days.

(21) Appl. No.: 17/742,637

(22) Filed: May 12, 2022

(65) Prior Publication Data

US 2023/0369023 A1 Nov. 16, 2023

(51) Int. Cl.
*H01J 37/32* (2006.01)
*C23C 16/458* (2006.01)
(Continued)

(52) U.S. Cl.
CPC .... *H01J 37/32577* (2013.01); *C23C 16/4585* (2013.01); *C23C 16/505* (2013.01); *H01J 37/32082* (2013.01); *H01J 37/32541* (2013.01); *H01J 37/32568* (2013.01); *H01J 37/32642* (2013.01); *H01J 37/32697* (2013.01); *H01L 21/311* (2013.01); *H01J 2237/036* (2013.01);
(Continued)

(58) Field of Classification Search
CPC .......... H01J 37/32577; H01J 37/32082; H01J 37/32541; H01J 37/32568; H01J 37/32642; H01J 37/32697; H01J 2237/036; H01J 2237/332; H01J 2237/334; C23C 16/4585; C23C 16/04; C23C 16/45565; C23C 16/505; H01L 21/311; H01L 21/02274
See application file for complete search history.

(56) References Cited

U.S. PATENT DOCUMENTS

| | | | | |
|---|---|---|---|---|
| 2008/0179297 A1* | 7/2008 | Bailey | ............... | H01J 37/32568 219/69.15 |
| 2011/0214687 A1* | 9/2011 | Bailey, III | ........ | H01J 37/32568 134/1.1 |

(Continued)

FOREIGN PATENT DOCUMENTS

| | | | | |
|---|---|---|---|---|
| KR | 20140098715 A | * | 8/2014 | |
| WO | WO-2020081644 A1 | * | 4/2020 | ........ H01J 37/32091 |
| WO | WO-2022051073 A1 | * | 3/2022 | ........ H01J 37/32091 |

*Primary Examiner* — Jeffrie R Lund
(74) *Attorney, Agent, or Firm* — Cooper Legal Group, LLC

(57) ABSTRACT

A tunable plasma exclusion zone in semiconductor fabrication is provided. A semiconductor wafer is provided within a chamber of a plasma processing apparatus between a first plasma electrode and a second plasma electrode. A plasma is generated from a process gas within the chamber and an electric field between the first plasma electrode and the second plasma electrode. The plasma is at least partially excluded from an edge region of the semiconductor wafer by a plasma exclusion zone (PEZ) ring within the chamber. The plasma may be tuned toward a center of the semiconductor wafer by electrically coupling an electrode ring of the PEZ ring to a voltage potential.

20 Claims, 14 Drawing Sheets

(51) Int. Cl.
*C23C 16/505* (2006.01)
*H01L 21/311* (2006.01)

(52) U.S. Cl.
CPC ... *H01J 2237/332* (2013.01); *H01J 2237/334* (2013.01)

(56) References Cited

U.S. PATENT DOCUMENTS

| | | | |
|---|---|---|---|
| 2014/0020708 A1* | 1/2014 | Kim | H01J 37/32091 134/1.1 |
| 2015/0013906 A1* | 1/2015 | Fischer | H01J 37/32366 156/345.24 |
| 2015/0099365 A1* | 4/2015 | Chen | H01J 37/32091 156/345.24 |
| 2016/0042927 A1* | 2/2016 | Kim | H01J 37/32568 134/1.1 |
| 2017/0301565 A1* | 10/2017 | Fang | H01L 21/67028 |
| 2018/0151335 A1* | 5/2018 | Wu | H01J 37/32477 |
| 2021/0134663 A1* | 5/2021 | Huang | H01L 25/50 |
| 2021/0151297 A1* | 5/2021 | Chen | H01J 37/32385 |
| 2023/0178419 A1* | 6/2023 | Colombeau | C23C 16/56 118/723 R |
| 2023/0369023 A1* | 11/2023 | Yang | H01J 37/32697 |
| 2024/0387148 A1* | 11/2024 | Yang | C23C 16/505 |

\* cited by examiner

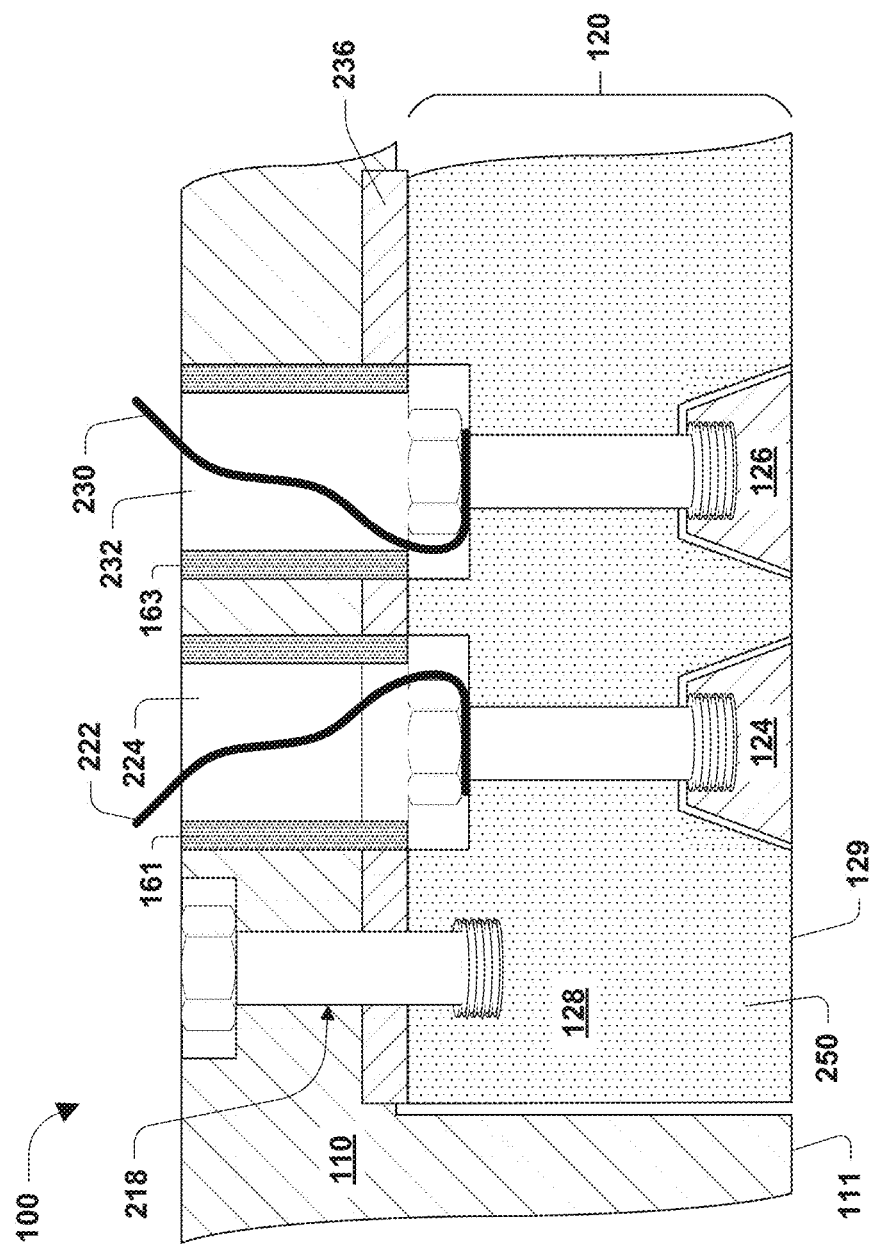

TUNABLE PLASMA EXCLUSION ZONE IN SEMICONDUCTOR FABRICATION

BACKGROUND

Plasma deposition and plasma etching is useful in the fabrication of integrated circuits (ICs). When an IC is built up layer-by-layer on a surface of a semiconductor wafer, a number of insulating or dielectric layers, conductive layers, and/or semiconductor layers of materials are deposited over a semiconductor wafer, and the various material layers are patterned using lithography, for example, to form circuit elements and/or components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D illustrate an implementation of a tunable plasma exclusion zone for semiconductor fabrication, according to some embodiments.

DETAILED DESCRIPTION

Figure 1A:
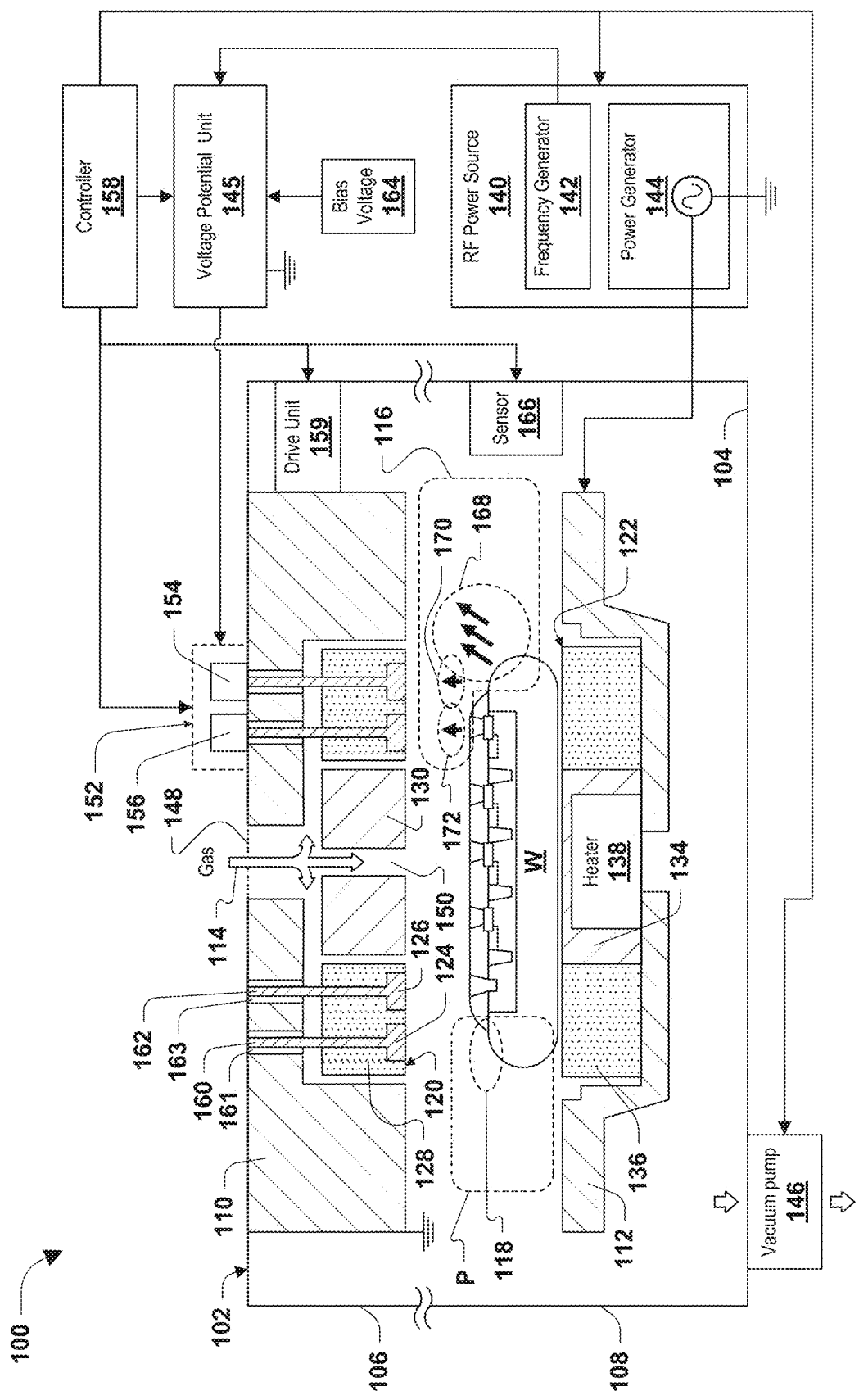
FIGS. 1A-1B illustrate an implementation of a tunable plasma exclusion zone for semiconductor fabrication, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

In the processing of a semiconductor wafer, various fabrication operations, such as plasma deposition, might produce an uneven region about an edge of a top surface and/or a bottom surface of the semiconductor wafer. An uneven region, such as a bevel or a protrusion, may impede subsequent fabrication. A bevel may, for example, weaken layers on the semiconductor wafer, which may peel or flake off and degrade circuit elements and/or components or contaminate other semiconductor wafers to be processed. A protrusion may, for example, impede subsequent fabrication operations, such as chemical mechanical polishing (CMP) or planarization, which are often employed to smooth the surfaces of the semiconductor wafer. A bevel or a protrusion may also impede bonding of the semiconductor wafer to another component, such as packaging or another semiconductor wafer. Methods, apparatuses, and/or systems for a tunable plasma exclusion zone in semiconductor fabrication are provided. According to some embodiments, a plasma is used to deposit dielectric material onto an edge region of a semiconductor wafer, such as a beveled edge, and thereby rebuild the edge. According to some embodiments, the plasma is used to etch, and thereby remove, dielectric material from an edge region of a semiconductor wafer, such as the beveled edge. Edge-rebuilding and/or edge material removal may benefit subsequent fabrication operations, such as three-dimensional (3D) stacking of a semiconductor wafer with another semiconductor wafer to produce a 3D IC. Such 3D ICs may be stacked vertically, also known as the z-direction, and interconnected by through-silicon vias (TSVs), copper-to-copper (Cu—Cu) connections, or other connections to behave as a single component or device. 3D ICs may achieve improved performance at reduced power levels and with a smaller footprint than two-dimensional processes. In some embodiments, a dielectric material, such as an oxide film, may be deposited and/or etched about the edge of the semiconductor wafer by a plasma to allow the edge of the semiconductor wafer to have a desired profile which, in turn, facilitates stacking of the semiconductor with other wafers, for example. In some embodiments, deposition and/or other formation of dielectric and/or other material about the edge of the semiconductor wafer is known as bevel edge deposition (BvD). In some embodiments, etching and/or other removal of dielectric and/or other material about the edge of the semiconductor wafer is known as bevel edge etching (BvE). As set forth in greater detail herein, a location of material deposition about the edge of the semiconductor wafer and a rate of material deposition may relate to strength of an electric field generated between a pair of plasma electrodes and interaction of the plasma with the semiconductor wafer. The plasma may be generated by a radio frequency (RF) power source and at least partially excluded from an edge region of the semiconductor wafer by a plasma exclusion zone (PEZ) ring of a tunable plasma exclusion zone. A first plasma electrode may cooperate with the PEZ ring to limit plasma deposition on a first surface, such as a top surface, of the semiconductor wafer and provide a plasma exclusion zone. A second plasma electrode may cooperate with a second PEZ ring to limit plasma deposition on a second surface, such as a bottom surface, of the semiconductor wafer and provide a second plasma exclusion zone. The plasma may be tuned toward a center of the semiconductor wafer by electrically coupling an electrode ring of the PEZ ring, fastened to a dielectric ring of the PEZ ring, to a voltage potential.

FIGS. 1A-1E illustrate an implementation 100 of a tunable plasma exclusion zone for semiconductor fabrication, according to some embodiments. In some embodiments and as illustrated in FIG. 1A, a plasma processing apparatus 102 is configured to perform a bevel etching operation and/or a bevel deposition operation to a semiconductor wafer W. In the embodiment shown in FIG. 1, the plasma processing apparatus 102 has a shape that may be generally axially symmetric, but the embodiments are not limited thereto. The semiconductor wafer W is provided within a chamber 104 of the plasma processing apparatus 102. In some embodiments, the chamber 104 may be formed from a first structure 106 of the plasma processing apparatus 102 and a second structure 108 of the plasma processing apparatus. In some embodiments, the first structure 106 and the second structure 108 may be configured as shells that pivot about a side of the plasma processing apparatus 102 to provide placement of the semiconductor wafer W therein. In some embodiments, the first structure 106 and the second structure 108 may be a continuous structure and the semiconductor wafer W may be provided therein by wafer placement device, such as a robotic arm. In some embodiments, the plasma processing apparatus 102 is configured to perform an edge re-building process. In some embodiments, the edge re-building process may include BvD, BvE, or a combination of BvD and BvE.

According to some embodiments, the semiconductor wafer W may be provided within the chamber 104 between a first plasma electrode 110 and a second plasma electrode 112. A plasma P may be generated from a process gas 114 within the chamber 104 and an electric field 116 between the first plasma electrode 110 and the second plasma electrode 112. In some embodiments, the plasma P may be at least partially excluded from an edge region 118 of the semiconductor wafer W by a plasma exclusion zone (PEZ) ring, such as a PEZ ring 120, within the chamber 104 of the plasma processing apparatus 102. The PEZ ring 120 is illustrated in FIG. 1A as an upper PEZ ring above an upper surface of the semiconductor wafer W. In some embodiments, the plasma P may be at least partially excluded from the edge region 118 of the semiconductor wafer W by a second PEZ ring 122 within the chamber 104 of the plasma processing apparatus 102. The second PEZ ring 122 is illustrated in FIG. 1A as a lower PEZ ring below a lower surface of the semiconductor wafer W. The edge region 118 is illustrated in FIG. 1A about a portion of a top surface of the semiconductor wafer W. The edge region 118 may include a portion of the top surface of the semiconductor wafer W, a portion of a bottom surface of the semiconductor wafer W, a combination of the portion of the top surface and the portion of the bottom surface of the semiconductor wafer W, or other region about the edge of the semiconductor wafer W. The edge region 118 may change based on strength of the electric field 116, type of the process gas 114, or other factors set forth in greater detail herein.

According to some embodiments, the plasma P may be tuned toward the center of the semiconductor wafer W by electrically coupling or decoupling an electrode ring 124 and/or a second electrode ring 126 of the PEZ ring 120 to a voltage potential. In some embodiments, the electrode ring 124 and/or the second electrode ring 126 are fastened to a dielectric ring 128 of the PEZ ring 120. In some embodiments, as set forth in greater detail herein, the dielectric ring 128 may have a radius greater than or equal to 140 mm and less than or equal to 150 mm. The electrode ring 124 and/or the second electrode ring 126 may be embedded electrode (s). In some embodiments, the PEZ ring 120 may be configured to be removably affixed in the chamber 104 above the semiconductor wafer W. The PEZ ring 120 may be configured to be removably affixed in the chamber 104 to a component of the plasma processing apparatus 102, such as the top plate 130, the first plasma electrode 110, the first structure 106, another structure within the chamber 104 of the plasma processing apparatus 102, or combinations thereof. The dielectric ring 128 may be configured to interact with the electric field 116 that directs the plasma P within the chamber 104 toward or away from the edge region 118 of the semiconductor wafer W. In some embodiments, the dielectric ring 128 may partially exclude the plasma P from the edge region 118 of the semiconductor wafer W and provide the plasma exclusion zone.

According to some embodiments, the semiconductor wafer W may be supported within the chamber 104 by a stage 134, which may be configured to retain the semiconductor wafer W between the first plasma electrode 110 and the second plasma electrode 112. In some embodiments, the semiconductor wafer W may be manually provided onto the stage 134. In some embodiments, the semiconductor wafer W may be provided onto the stage 134 by a wafer placement device, such as a robotic arm. In some embodiments, the stage 134 may be configured as an electrostatic chuck for securing the semiconductor wafer W. The PEZ ring 120 may be configured to encircle at least a portion of the stage 134 above the semiconductor wafer W. The second PEZ ring 122 may be configured to encircle at least a portion of the stage 134 below the semiconductor wafer W. The second PEZ ring 122 may be configured to be removably affixed in the chamber 104 to a component of the plasma processing apparatus 102, such as the stage 134, the second plasma electrode 112, the second structure 108, another structure within the chamber 104 of the plasma processing apparatus 102, or combinations thereof. The second PEZ ring 122 may include a second dielectric ring 136 to partially exclude the plasma P from the edge region 118 of the semiconductor wafer W and provide a second plasma exclusion zone. In some embodiments, the plasma exclusion zone provided by the PEZ ring 120 and the second plasma exclusion zone provided by the second PEZ ring 122 are the same plasma exclusion zone or form components of the same plasma exclusion zone.

In some embodiments, a heater 138 may be provided within the chamber 104 to provide a source of heat to the stage 134 and/or the semiconductor wafer W. The application of heat by the heater 138 may reduce thermal stress in the semiconductor wafer W, which may be caused by the transfer of heat to the semiconductor wafer W from the plasma P. Such thermal stress may cause bowing of the semiconductor wafer W, which may impede subsequent processing operations. The heater 138 may heat the semiconductor wafer W between about 50° C. and 500° C., between about 200° C. and 400° C., or about 300° C. In some embodiments, the stage 134 may be coupled to the second plasma electrode 112 for biasing the semiconductor wafer W with respect to the electric field 116. In some embodiments, the stage 134 may be separated from the second plasma electrode 112 and/or the heater 138 by an insulating material (not shown).

According to some embodiments, the electric field 116 may be provided by an RF power source 140, set forth in greater detail herein. In some embodiments, the RF power source 140 may include a frequency generator 142 and/or a power generator 144. The frequency generator may determine and/or set a radio frequency component of the electric field 116. In some embodiments, the frequency generator 142 may output an RF signal that may then be amplified by the power generator 144 to create an amplified RF signal. In some embodiments, the power generator 144 may apply power to the RF signal output by the frequency generator, such as during a plasma deposition operation or a plasma etching operation. The power applied by the power generator 144 may range from about 200 watts (W) to about 1000 W, or about 300 W to about 700 W. In some embodiments, the amplified RF signal output by the power generator 144 may be coupled to the first plasma electrode 110 or the second plasma electrode 112. As illustrated in FIG. 1A, the amplified RF signal is coupled to the second plasma electrode 112 and the first plasma electrode 110 is coupled to ground. In some embodiments, the amplified RF signal may be coupled to the first plasma electrode 110 and the second plasma electrode 112 may be coupled to ground. A difference in voltage potential between the first plasma electrode 110 and the second plasma electrode 112 may direct the plasma P toward the center of the semiconductor wafer W provided on the stage 134 within the chamber 104 of the plasma processing apparatus. In some embodiments, the voltage potential between the first plasma electrode 110 and the second plasma electrode 112 may interact with the electric field 116 to direct the plasma P. In some embodiments, the RF power source 140 may generate and/or supply an alternating current (AC) signal to a coupled plasma electrode to energize the process gas 114 and create the plasma P. An ionization rate of the plasma P may be controlled through frequency and/or power of the AC signal. In some embodiments, the RF power source 140 includes a direct current (DC) power source to generate and/or supply a DC signal and/or a DC component of an AC signal to the coupled plasma electrode.

According to some embodiments, the first plasma electrode 110 or the second plasma electrode 112 may comprise a modular high-frequency plasma electrode that includes, for example, an array of high-frequency plasma electrodes. As used herein, "high-frequency" may refer to high-frequency electromagnetic radiation, which includes one or more of: radio frequency radiation, very-high-frequency radiation, ultra-high-frequency radiation, or microwave radiation. "High-frequency" may refer to frequencies between 0.1 MHz and 300 GHz. For example, the RF power source 140 may provide a high-frequency source of power between 300 W and 1000 W, or greater, such as about 3000 W. In some embodiments, the DC signal may be set by a control signal from the controller 158. In some embodiments, the DC signal may be between 0 and 100 V, such as 20 V, to direct the plasma P in the chamber 104. In some embodiments, a plasma density distribution of the plasma P about the edge region 118 of the semiconductor wafer W may be controlled by the DC signal.

According to some embodiments, the implementation 100 may include a vacuum pump 146 that is configured to evacuate the chamber 104 and draw the process gas 114 through one or more inlets, such as a chamber inlet 148. During a bevel etch or a bevel deposition operation, the vacuum pump 146 may evacuate the chamber 104 below ambient pressure. For example, the vacuum pump may evacuate the chamber 104 to a chamber pressure in the range of 500 mTorr to 2 Torr. The one or more inlets, such as the chamber inlet 148, may be provided within the first plasma electrode 110. The one or more inlets may be provided within the top plate 130 and may include a top plate inlet 150. In some embodiments, the one or more inlets may be provided between the first plasma electrode 110 and the top plate 130. The one or more inlets may vary in size (e.g., diameter), shape, quantity, location, and/or density to provide suitable delivery of the process gas 114 to the chamber 104. In some embodiments, the one or more inlets may be provided in a showerhead configuration. The one or more inlets may include an adjustable inlet that may be set by a spacing element. The spacing element may be included within an inlet, such as the chamber inlet 148 or the top plate inlet 150, or between the first plasma electrode 110 and the top plate 130. In some embodiments, the one or more inlets may include other inlets into the chamber 104, such as inlets about an outer periphery of the first plasma electrode 110, or provided in any combination set forth herein. In some embodiments, the top plate 130 may be fastened to the first structure 106, the first plasma electrode 110, another supporting structure within the chamber 104, or combinations thereof. The top plate 130 may be fabricated from stainless steel, aluminum (Al), or other material. The first plasma electrode 110 may be fastened to the first structure 106, another supporting structure within the chamber 104, or combinations thereof. The second plasma electrode 112 may be fastened to the second structure 108, another supporting structure within the chamber 104, or combinations thereof.

According to some embodiments, the electrode ring 124 and/or the second electrode ring 126, of the PEZ ring 120, is connected to a voltage potential by a switch unit 152. The switch unit 152 may selectively couple the electrode ring 124 to a first voltage potential with a first switch 154 and may selectively couple the second electrode ring 126 to a second voltage potential with a second switch 156. In some embodiments, the first voltage potential is the same as the second voltage potential. In some embodiments, the first voltage potential and/or the second voltage potential is ground. For example, when the first plasma electrode 110 is coupled to ground, the first switch 154 may selectively couple the electrode ring 124 to ground and the second switch 156 may selectively couple the second electrode ring 126 to ground. In some embodiments, the first switch 154 or the second switch 156 is a manual switch that may be manually engaged by a user to respectively couple the electrode ring 124 or the second electrode ring 126 to ground. In some embodiments, the first switch 154 or the second switch 156 is an electronically controlled switch that may be engaged in response to a control signal from the controller 158. In some embodiments, the first switch 154 or the second switch 156 may be selectively engaged before and/or during a bevel etch operation to tune the plasma P toward or away from the center of the semiconductor wafer W. In some embodiments, the first switch 154 or the second switch 156 may be selectively engaged before and/or during a bevel deposition operation to tune the plasma P toward or away from the center of the semiconductor wafer W.

According to some embodiments, the first switch 154 may be coupled to an electrical connector 160 that is coupled to the electrode ring 124 and the second switch 156 may be coupled to a second electrical connector 162 that is coupled to the second electrode ring 126. The electrical connector 160 may pass through the first plasma electrode 110 and may be surrounded by a first insulating jacket 161. The second electrical connector 162 may pass through the first plasma electrode 110 and may be surrounded by a second insulating jacket 163. The first insulating jacket 161 and/or the second insulating jacket 163 may be formed from an insulating material such as a thermoplastic material or a thermo setting material, and each may be surrounded by one or more insulating jackets. The first insulating jacket 161 and/or the second insulating jacket 163 may include a fluorocarbon-based fluoroelastomer material, such as fluoro-rubber (FKM), and/or a perfluoroelastomer material, such as perfluoroelastomer-rubber (FFKM). FKM is an ASTM International (ASTM) standard designation D1418 for a class of fluorinated, carbon-based synthetic rubber, commonly known as fluoroelastomer. FKM is also known by the fluoroelastomer category (FPM) according to the International Organization for Standardization (ISO) standard designation ISO 1629, and is also known as fluorine rubber. FKM contains vinylidene fluoride as a monomer. FKM may provide heat resistance in temperatures greater than 200° C. and may provide resistance to high pressures, chemicals and/or other fluids. FFKM is designated by ASTM as standard 1418. FFKM materials contain a higher amount of fluorine than FKM fluoroelastomers. FFKM materials may provide resistance to plasma environments in higher service temperature conditions. FFKM materials provide resistance to contact with hydrocarbons or highly corrosive fluids, or plasmas over a range of temperatures from ambient temperature to over 320° C. According to some embodiments, the first insulating jacket 161 and/or the second insulating jacket 163 may include one or more other materials such as silicone, vinyl-methyl-silicone (VMQ), nitrile butadiene rubber (NBR), polytetrafluoroethylene (PTFE), fluorosilicone rubber (FVMQ), and/or silicone rubber. Other materials and/or configurations of the first insulating jacket 161 and/or the second insulating jacket 163 are within the scope of the present disclosure.

According to some embodiments, a voltage potential unit 145 provides the voltage potential to the switch unit 152. For example, the voltage potential unit 145 may provide the first voltage potential to the first switch 154 and may provide the second voltage potential to the second switch 156. In some embodiments, the voltage potential unit 145 is an electrical connector coupled to ground, a bias voltage 164, or the frequency generator 142 of the RF power source 140. In some embodiments, the voltage potential unit 145 is a switch that selectively couples the switch unit 152 to ground, the bias voltage 164, or the frequency generator 142. For example, the voltage potential unit 145 may be configured as a switch that is controlled by a control signal from the controller 158. In some embodiments, the voltage potential unit 145 includes a voltage amplifier that may variably control the voltage potential, such as a magnitude of the bias voltage 164 or a magnitude of an oscillating voltage output by the frequency generator 142, in response to a control signal from the controller 158. The voltage potential unit 145 may variably control the voltage potential before or during a bevel etch operation or a bevel deposition operation to tune the plasma P toward or away from the center of the semiconductor wafer W. In some embodiments, the bias voltage 164 is a fixed voltage, such as between 0 V and 100 V, that may be increased or decreased by the voltage potential unit 145. For example, the bias voltage 164 may be 20 V. In some embodiments, the bias voltage 164 is a fixed voltage that is a percentage of a DC component of the voltage across the first plasma electrode 110 and the second plasma electrode 112, such as between 0% and 100%, that may be increased or decreased by the voltage potential unit 145. Other arrangements and/or configurations for controlling the voltage potential provided by the voltage potential unit 145 are within the scope of the present disclosure.

According to some embodiments, the electric field 116 may include a field component 168 that is generated between the first plasma electrode 110 and the second plasma electrode 112. The electric field 116 may include a first tuning component 170 that is generated when the electrode ring 124 is engaged by the first switch 154. The plasma P may be tuned toward the center of the semiconductor wafer W by the first tuning component 170 through electrical coupling of the electrode ring 124 to the voltage potential. The electric field 116 may include a second tuning component 172 that is generated when the second electrode ring 126 is engaged by the second switch 156. The plasma P may be tuned toward the center of the semiconductor wafer W by the second tuning component 172 through electrical coupling of the second electrode ring 126 to the voltage potential. The field component 168, the first tuning component 170, or the second tuning component 172 may be provided in the electric field 116 individually, in combination with other components of the electric field 116, or in combination with one or more additional electric field components.

According to some embodiments, the plasma processing apparatus 102 includes a sensor 166 to measure a processing parameter. In some embodiments, the sensor 166 may be configured as a gap sensor to measure a vertical gap between the first plasma electrode 110 and the second plasma electrode 112. In some embodiments, the sensor 166 may be configured as a removable sensor that is removably fixed in the chamber 104 of the plasma processing apparatus 102. The sensor 166 may be configured to measure a distance between the PEZ ring 120 and the edge region 118 or a distance between the PEZ ring 120 and the top surface of the semiconductor wafer W. In some embodiments, the sensor 166 may be configured to measure a distance between the dielectric ring 128 and the edge region 118 or a distance between the dielectric ring 128 and the top surface of the semiconductor wafer W. In some embodiments, the sensor 166 may be configured to measure a distance between the electrode ring 124 and the edge region 118 or a distance between the electrode ring 124 and the top surface of the semiconductor wafer W. In some embodiments, the sensor 166 may be configured to measure a distance between the second electrode ring 126 and the edge region 118 or a distance between the second electrode ring 126 and the top surface of the semiconductor wafer W.

In some embodiments, the PEZ ring 120, the dielectric ring 128, the electrode ring 124, and/or the second electrode ring 126 may be configured to interact with the electric field 116 to direct the plasma P within the chamber 104 toward or away from the edge region 118 of the semiconductor wafer W. The sensor 166 may output a signal corresponding to a measured processing parameter, such as the vertical gap, to the controller 158. In some embodiments, the controller 158 may be configured to control a drive unit 159 to adjust a distance between components of the plasma processing apparatus 102, or to adjust a distance between one or more components and the semiconductor wafer W. The drive unit 159 may be located within the chamber 104 of the plasma processing apparatus 102 and may be configured to drive the first plasma electrode 110 toward or away from the second plasma electrode 112. The drive unit 159 may include mechanical components, such as gear or pins, which are mechanically connected to a drive motor. Components of the drive unit 159 may be mechanically coupled to the first structure 106, the second structure 108, the first plasma electrode 110, the second plasma electrode, or combinations thereof. Components of the drive unit 159, such the drive motor, may be located outside of the chamber 104 and may control other mechanical components within the chamber 104. In some embodiments, the drive unit 159 may adjust a distance between the first plasma electrode 110 and the second plasma electrode 112, a distance between the first plasma electrode 110 and the top surface of the semiconductor wafer W, a distance between the PEZ ring 120 and the top surface of the semiconductor wafer W, a distance between the electrode ring 124 and the top surface of the semiconductor wafer W, a distance between the second electrode ring 126 and the top surface of the semiconductor wafer W, other distances, or combinations thereof.

According to some embodiments, the sensor 166 may be configured as an electric field sensor to measure the electric field 116 and/or components of the electric field. For example, the sensor 166 may be configured to measure the field component 168 between the first plasma electrode 110 and the second plasma electrode 112. In some embodiments, the sensor 166 is a removable sensor that may be inserted into the chamber 104. The sensor 166 may be removably fastened to the first structure 106 and/or the second structure 108, and may output a signal to the controller 158. The sensor 166 may be provided in-situ or may be removably provided in-situ, within the chamber 104, to measure the processing parameter. In some embodiments, the sensor 166 may be an atomic force microscope that is removably provided in-situ within the chamber 104 to detect an edge profile of the semiconductor wafer W. For example, the process gas 114 may be evacuated from the chamber 104 by the vacuum pump 146 and the electric field 116 may be turned OFF while the semiconductor wafer W is retained on the stage 134 and the edge profile is measured by the sensor 166.

In some embodiments, the sensor 166 may be a laser sensor, an inductive sensor, a capacitive sensor, an acoustic sensor, a linear variable differential transformer (LVDT) sensor, or other type of sensor to measure the processing parameter. In some embodiments, the sensor 166 may be a detection panel, such as a semiconductor detection panel, configured to produce an electrical signal corresponding to an intensity of radiation impinging on a radiation detecting element. Examples of radiation detecting elements include a charge-coupled device (CCD), a complementary metal-oxide-semiconductor (CMOS) radiation detecting panel, an array of radiation detecting elements, such as photodiodes, a CMOS active pixel image sensor (APS), a pinned photodiode (PPD) array, a front side illuminated (FSI) image sensor, a back side illuminated (BSI) image sensor, or other type of semiconductor image sensor. The sensor 166 can be located inside the chamber 104, outside the chamber 104, or both inside and outside the chamber 104, such as passing through the first structure 106 or the second structure 108 of the plasma processing apparatus 102. Other arrangements and/or configurations of the sensor 166 for measuring the processing parameter are within the scope of the present disclosure.

According to some embodiments, the PEZ ring 120 may be used to protect the top plate 130, a portion of the semiconductor wafer W, or other structure of the plasma processing apparatus 102 by limiting exposure to the plasma P. The second PEZ ring 122 may be used to protect the stage 134, the heater 138, a portion of the semiconductor wafer W, or other structure of the plasma processing apparatus 102 by limiting exposure to the plasma P. The PEZ ring 120 may define an upper plasma exclusion zone on the top surface of the semiconductor wafer W where the plasma P used for depositing or etching a material with respect to the edge region 118 of the semiconductor wafer W is blocked or partially blocked. The PEZ ring 120 may be configured to face the top surface of the semiconductor wafer W and have a diameter greater than, less than, or equal to a diameter of the semiconductor wafer W. The second PEZ ring 122 may define a lower plasma exclusion zone on the bottom surface of the semiconductor wafer W where the plasma P used for depositing or etching a material with respect to the edge region 118 of the semiconductor wafer W is blocked or partially blocked. In some embodiments, the second PEZ ring 122 is positioned around the stage 134 and includes a ring surface for supporting the semiconductor wafer W. The second PEZ ring 122 may be configured to face the bottom surface of the semiconductor wafer W and have a diameter greater than, less than, or equal to a diameter of the semiconductor wafer W. By changing a diameter of the PEZ ring 120 and/or a diameter of the second PEZ ring 122 with respect to a diameter of the semiconductor wafer W, a degree of material deposition or material etch with respect to the edge region 118 of the semiconductor wafer W may be controlled.

In some embodiments, the dielectric rings, such as the dielectric ring 128 of the PEZ ring 120 or the second dielectric ring 136 of the second PEZ ring 122, may be formed of a semiconductive or dielectric material. Different types of dielectric materials may have different dielectric constants, thereby affecting the electric field 116, the plasma P, and/or a plasma distribution profile of the plasma P in different manners. Example dielectric materials include quartz, aluminum oxide ($Al_2O_3$), aluminum nitride (AlN), lanthanum oxide ($La_2O_3$), hafnium oxide ($HfO_2$), hafnium silicon oxide ($HfSiO_4$), tantalum oxide ($Ta_2O_5$), titanium dioxide ($TiO_2$), silicon dioxide ($SiO_2$), silicon carbide (SiC), silicon nitride ($Si_3N_4$), silicon (Si), strontium titanium oxide ($SrTiO_3$), yttrium oxide ($Y_2O_3$), zirconium oxide ($ZrO_2$), zirconium silicon oxide (ZrSiO4), other dielectric materials, or combinations thereof. The dielectric rings may be a composite material that includes a metal, a ceramic, a polymer, or combinations thereof. The dielectric rings may be coated with an anti-corrosion material, such as Si, SiC, or $Y_2O_3$ to reduce contamination of the semiconductor substrate W during plasma etching or plasma deposition. The dielectric rings may be formed of a material having a high electrical resistance, such as about 105 ohm-cm. The electrical coupling between the plasma electrodes and the dielectric rings may affected by the electrical properties of the dielectric rings. In some embodiments, the characteristics of the plasma P in the vicinity of the edge region 118 can be controlled by varying the material, location, and/or configuration of the dielectric rings.

In some embodiments, the plasma electrodes, such as the first plasma electrode 110 and the second plasma electrode 112, may be formed of a metal, a metal alloy, a composite including a metal, or combinations thereof. Example metals include aluminum (Al), anodized aluminum, tungsten (W), titanium (Ti), tantalum (Ta), copper (Cu), titanium nitride (TiN), tantalum nitride (TaN), molybdenum (Mo), hafnium (Hf), other suitable metals or metal alloys, or combinations thereof. The electrode ring 124 or the second electrode ring 126 may be formed of a metal, a metal alloy, a composite including a metal, combinations thereof, and/or a metal included in the plasma electrodes. In some embodiments, the electrode ring 124 and the second electrode ring 126 are formed from the same material. Formation of the electrode ring 124 and the second electrode ring 126 from the same material may increase precision in tuning of the plasma P toward or away from the edge region 118 of the semiconductor wafer W. In some embodiments, the electrode ring 124 and the second electrode ring 126 are formed from the same material as the first plasma electrode 110 and the second plasma electrode 112. Formation of the electrode ring 124 and the second electrode ring 126 from the same material as the first plasma electrode 110 and the second plasma electrode 112 may increase precision in tuning of the plasma P toward or away from the edge region 118 of the semiconductor wafer W. If the plasma electrodes are exposed to or eroded by the plasma P in cases where high cleanness plasma is desired, it may be desirable to use a high purity material. In some embodiments, the plasma processing apparatus 102 may provide low-pressure chemical vapor deposition (LPCVD), plasma enhanced chemical vapor deposition (PECVD), high density plasma chemical vapor deposition (HDPCVD), sub atmospheric chemical vapor deposition (SACVD), reactive ion etch (RIE), neutral beam etch (NBE), or other types of plasma processing. The plasma processing apparatus 102 may be used in a wet etching process with, for example, hydrofluoric acid (HF), or used in a dry etching process with, for example, $HF_3$ and/or $NH_3$ gases. During the dry etching process, an inert gas such as Argon (Ar) may be included in the process gas 114. In some embodiments, during a cleaning operation, the power generator 144 of the RF power source 140 may apply an RF pulse of about 10% to about 90% of the power applied during an etching operation. In some embodiments, the power generator 144 may be configured to apply the RF pulse of about 20% to about 80%, about 30% to about 70%, or about 30% to about 50% of the power applied during an etching operation. In some embodiments, operating at the cleaning power higher than about 80% of the etching power may result in the stage 134 or other exposed components to be etched. In some embodiments, operating at the cleaning power lower than about 20% of the etching power may result in inadequate removal of dirt particles and/or other contaminants. In some embodiments, the etching power applied during an etching operation or a depositing operation may range from about 200 W to about 700 W.

According to some embodiments, the process gas 114 is inserted into the chamber 104 of the plasma processing apparatus 102 through the chamber inlet 148. The process gas 114 may include one or more gases, such as precursor gases, plasma generation gases, purge gases, treatment gases, cleaning gases, and/or other process gases. The process gas 114 may include precursors that can include inorganic and/or metalorganic components. Example precursor gases may include nitrogen ($N_2$), tetraethyl orthosilicate (TEOS), tetrachloride ($TiCl_4$), dichlorosilane (DCS) ($H_2SiCl_2$), trichlorosilane (TCS) ($SiCl_3H$), ammonia, and/or other compositions. Precursor gases may include elements, compounds, and/or combinations of elements such as N, Al, Si, Ti, Ga, Ge, Co, Sr, Y, Zr, Nb, Ru, Ba, La, Hf, Ta, Jr, Pb, Bi, W. Example treatment gases may include $N_2$, Ar, $H_2$, $O_2$, or the like. In some embodiments, the process gas 114 is a treatment gas, such as $N_2$ and the resulting plasma P is a nitrogen plasma. The treatment gas may be supplied at a flow rate of between about 50 standard cubic centimeters per minute (SCCM) ($cm^3$/min) to about 2000 SCCM, and RF plasma treatment may be provided at a pressure of between about 10 mTorr to about 1000 mTorr. Purge gases may include suitable inert gases. For plasma deposition, the process gas 114 may include silane ($SiH_4$), ammonia ($NH_3$), argon (Ar), tetraethyl orthosilicate (TEOS) ($Si(OC_2H_5)_4$), $O_2$, other process gases, other inert gases, or combinations thereof. For example, the process gas 114 may include a combination of silane ($SiH_4$) and ammonia ($NH_3$), with or without an inert gas such as Argon (Ar). In some embodiments, a component of the process gas 114 may be inserted into the chamber 104 through one or more inlets and a second component of the process gas 114 may be inserted through one or more different inlets. A cleaning gas may include an oxygen-containing gas, such as $O_2$. The cleaning gas may include a fluorine-containing gas, such as less than 10% of the cleaning gas. Example cleaning gases include $CF_4$, $SF_6$, or $C_2F_6$, other cleaning gases, or combinations thereof.

The semiconductor wafer W to be processed may be made of silicon or another semiconductor material. Alternatively or additionally, the semiconductor wafer W may include other elementary semiconductor materials, such as germanium (Ge). In some embodiments, the semiconductor wafer W is made of a compound semiconductor such as silicon carbide (SiC), gallium arsenic (GaAs), indium arsenide (InAs), or indium phosphide (InP). In some embodiments, the semiconductor wafer W is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer W includes an epitaxial layer. For example, the semiconductor wafer W may have an epitaxial layer overlying a bulk semiconductor. In some embodiments, the semiconductor wafer W may include a silicon-on-insulator (SOI) substrate, a germanium-on-insulator (GOI) substrate, and/or another type of substrate.

The semiconductor wafer W may include various device elements, which are illustrated on the top surface of the semiconductor wafer W in FIG. 1A. Additionally, or alternatively, the device elements may be included on the bottom surface of the semiconductor wafer W. Examples of device elements that are formed in the semiconductor wafer W include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, or other device elements. Various operations may be used to form the device elements, such as deposition, etching, implantation, photolithography, annealing, or other operations. In some embodiments, a dielectric layer may be formed on the top surface, the bottom surface, and/or a bevel edge of the semiconductor wafer W.

According to some embodiments, the plasma processing apparatus 102 may be configured to process different semiconductor wafers having different diameters. Diameters of semiconductor wafers have generally increased from 25.4 mm (1 inch) to above 400 mm, and have generally increased in thickness. Example semiconductor wafer dimensions may include: 150 mm (5.9 inch, usually referred to as "6 inch") having a typical thickness of 675 μm; 200 mm (7.9 inch, usually referred to as "8 inch") having a typical thickness of 725 μm; 300 mm (11.8 inch, usually referred to as "12 inch") having a typical thickness of 775 μm; and 450 mm (17.7 inch, usually referred to as "18 inch") having a thickness of 925 µm. Other semiconductor wafer dimensions to be used in the plasma processing apparatus 102 are within the scope of the present disclosure. Semiconductor wafers may vary in diameter about a set point during production. For example, at a set point of about 300 mm, various semiconductor wafers may have diameters between 290 mm and 310 mm, such as 292 mm, 294 mm, 296 mm, etc. In some embodiments, the plasma processing apparatus 102 may tune the electric field 116 inward, toward a center of a placed semiconductor wafer, to process semiconductor wafers with different diameters.

According to some embodiments, the semiconductor wafer W may be provided within the chamber 104 the plasma processing apparatus 102 between the first plasma electrode 110 and the second plasma electrode 112. The plasma P may be generated within the chamber 104 and at least partially excluded from the edge region 118 of the semiconductor wafer W by the PEZ ring 120. The plasma P may be tuned toward or away from the center of the semiconductor wafer W by selectively electrically coupling or decoupling the electrode ring 124 and/or the second electrode ring 126 to a voltage potential provided by the voltage potential unit 145. In a subsequent processing operation, the semiconductor wafer W may be removed and a second semiconductor wafer may be provided within the chamber 104 of the plasma processing apparatus 102 between the first plasma electrode 110 and the second plasma electrode 112. A second plasma may be generated from the process gas 114 within the chamber 104 and the electric field 116 between the first plasma electrode 110 and the second plasma electrode 112. The second plasma may be at least partially excluded from a second edge region of the second semiconductor wafer by the PEZ ring 120 within the chamber 104 of the plasma processing apparatus 102. The second plasma may be tuned toward or away from a center of the second semiconductor wafer by electrically coupling or decoupling the electrode ring 124 and/or the second electrode ring 126 to the voltage potential provided by the voltage potential unit 145.

In an example embodiment for processing one or more semiconductor wafers, the semiconductor wafer W may be 294 mm in diameter and the field component 168 of the electric field 116 may be configured to tune the plasma P to deposit a dielectric material about the edge region 118. A second semiconductor wafer W to be processed may be 292 mm in diameter and the electrode ring 124 may be coupled to the voltage potential by the switch unit 152 to generate the first tuning component 170 of the electric field 116 to tune the plasma P toward a center of the second semiconductor wafer. In this example, the plasma processing apparatus 102 may process the second semiconductor wafer without replacement of the PEZ ring 120 by another PEZ ring having a different diameter, such as a smaller diameter. In an example embodiment, a third semiconductor wafer W to be processed may be 290 mm in diameter, and the electrode ring 124 and the second electrode ring 126 may be coupled to the voltage potential by the switch unit 152 to generate the first tuning component 170 and the second tuning component 172 of the electric field 116 to tune the plasma P toward a center of the third semiconductor wafer. In this example, the plasma processing apparatus 102 may process the third semiconductor wafer without replacement of the PEZ ring 120 by another PEZ ring having a different diameter, such as a smaller diameter. The foregoing are provided merely as example embodiments. Other arrangements and/or configurations of the PEZ ring 120 are within the scope of the present disclosure. For example, various parameters, such as semiconductor wafer dimensions, electric field intensity, distances between components, etc. may be changed to process multiple semiconductor wafers having different dimensions without removal and replacement of the PEZ ring 120.

Figure 1B:
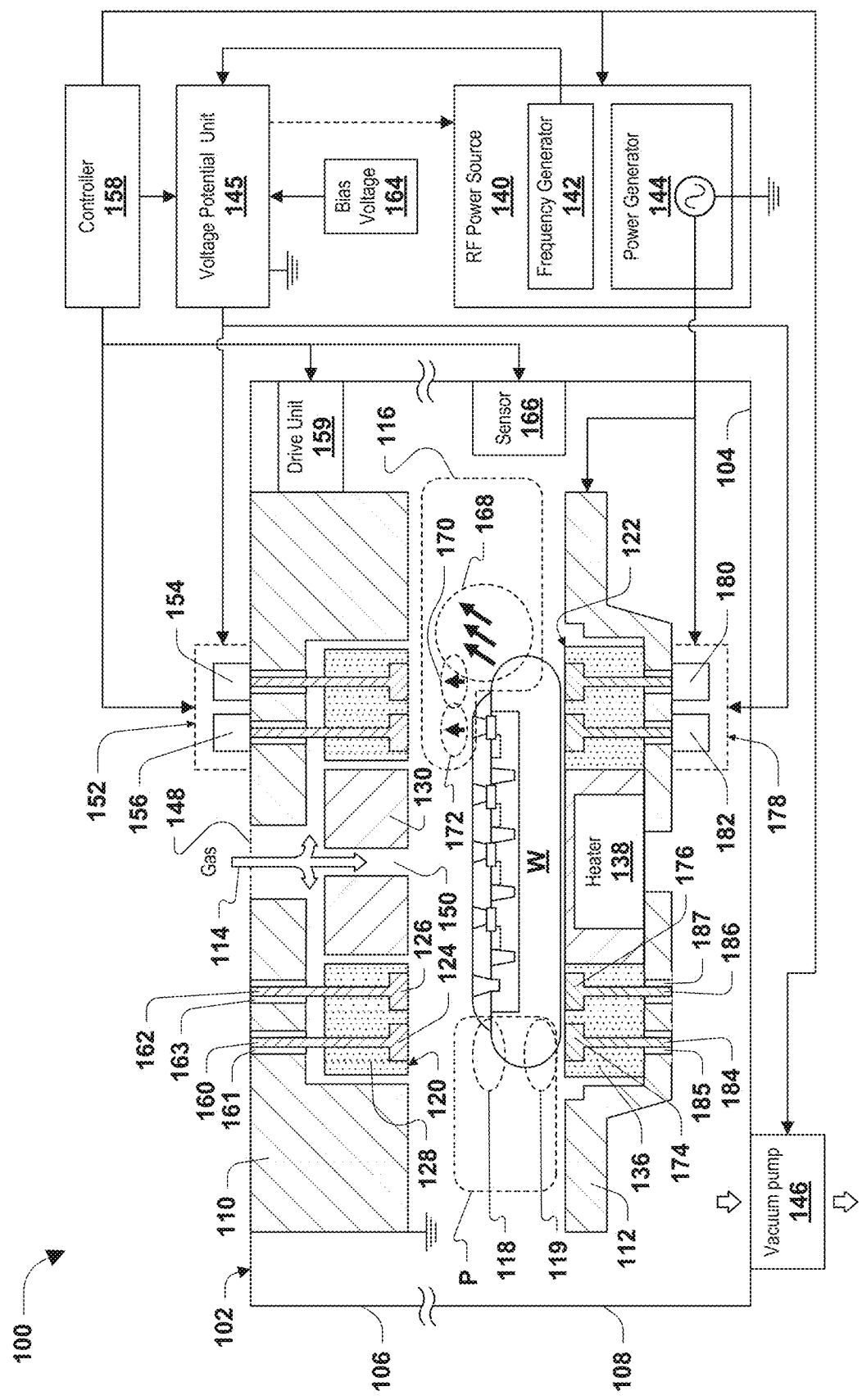

In some embodiments and as illustrated in FIG. 1B, the second PEZ ring 122 includes a third electrode ring 174 and a fourth electrode ring 176. In some embodiments, the third electrode ring 174 and/or the fourth electrode ring 176 are fastened to the second dielectric ring 136 of the second PEZ ring 122. The second dielectric ring 136 may be configured to interact with the electric field 116 that directs the plasma P within the chamber 104 toward or away from a second edge region 119 of the semiconductor wafer W. The second dielectric ring 136 may partially exclude the plasma P from the second edge region 119 of the semiconductor wafer W. The third electrode ring 174 and/or the fourth electrode ring 176 may be connected to a voltage potential by a second switch unit 178. The second switch unit 178 may selectively couple the third electrode ring 174 to a third voltage potential with a third switch 180 and may selectively couple the fourth electrode ring 176 to a fourth voltage potential with a fourth switch 182. In some embodiments, the third switch 180 is coupled to a third electrical connector 184 that is coupled to the third electrode ring 174 and the fourth switch 182 is coupled to a fourth electrical connector 186 that is coupled to the fourth electrode ring 176. The third electrical connector 184 may pass through the second plasma electrode 112 and may be surrounded by a third insulating jacket 185. The fourth electrical connector 186 may pass through the second plasma electrode 112 and may be surrounded by a fourth insulating jacket 187.

In some embodiments, the third voltage potential is the same as the fourth voltage potential. In some embodiments, the third voltage potential or the fourth voltage potential is a voltage potential set by the voltage potential unit 145, as set forth in greater detail herein. In some embodiments, the third voltage potential or the fourth voltage potential is a DC component of the RF signal output by the power generator 144 of the RF power source 140. In some embodiments, the third voltage potential or the fourth voltage potential is the RF signal output by the power generator 144 of the RF power source 140. For example, when the first plasma electrode 110 is coupled to ground, the third switch 180 may selectively couple the third electrode ring 174 to the RF signal and the fourth switch 182 may selectively couple the fourth electrode ring 176 to the RF signal. In some embodiments, the third switch 180 or the fourth switch 182 is a manual switch that may be manually engaged by a user to couple the third electrode ring 174 or the fourth electrode ring 176 to the RF signal. In some embodiments, the third switch 180 or the fourth switch 182 is an electronically controlled switch that may be engaged in response to a control signal from the controller 158. In some embodiments, the third switch 180 or the fourth switch 182 may be selectively engaged before or during a bevel etch operation or a bevel deposition operation to tune the plasma P toward or away from the center of the semiconductor wafer W. In some embodiments, an edge profile of the semiconductor wafer W may be tuned in the chamber 104 of the plasma processing apparatus 102 (e.g., BvD and/or BvE) such that an extra chamber for different PEZ ring sizes is not needed. For example, edge re-building may be performed within a single chamber, such as the chamber 104, to reduce cycle time, costs, etc. for processing a plurality of semiconductor wafers. Other arrangements and/or configurations of the PEZ ring 120 and/or the second PEZ ring 122 are within the scope of the present disclosure.

Figure 2A:
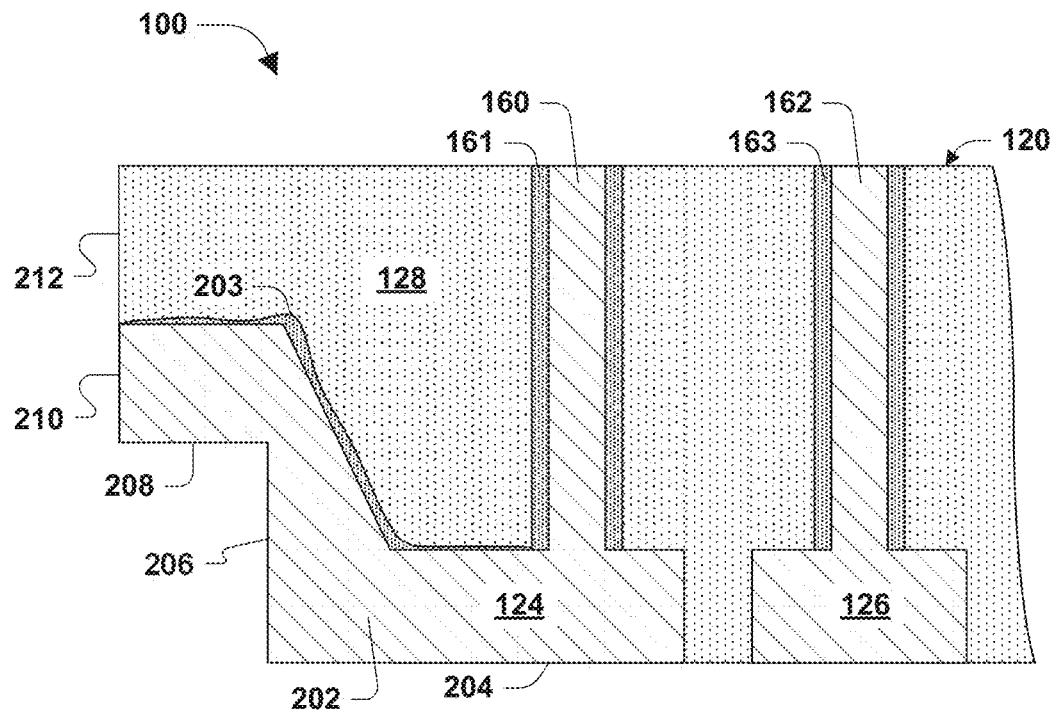

FIGS. 2A-2D illustrate an implementation 100 of a tunable plasma exclusion zone for semiconductor fabrication, according to some embodiments. With reference to FIG. 2A, the implementation 100 may include the PEZ ring 120 configured as an upper PEZ ring above an upper surface of the semiconductor wafer W in the chamber 104 or as a lower PEZ ring below a lower surface of the semiconductor wafer W in the chamber 104. In some embodiments, the PEZ ring 120 includes the electrode ring 124 with a different shape than the second electrode ring 126. The electrode ring 124 may be configured with an electrode body 202 that surrounds at least a portion of the dielectric ring 128. In some embodiments, the electrode body 202 of the electrode ring 124 is fastened to the dielectric ring 128 with a bonding material 203. In FIG. 2A, illustration of the bonding material 203 is exaggerated for clarity. The bonding material 203 may bond at least a portion of a non-facing side of the electrode body 202 to at least a portion of the dielectric ring 128. According to some embodiments, the bonding material 203 may include an adhesive, such as a single component epoxy adhesive or a dual component epoxy adhesive. The bonding material 203 may include a structural adhesive, such as a structural acrylic adhesive, an epoxy, and/or a combination of a structural adhesive and an epoxy. The bonding material 203 may include another adhesive component, such as an anaerobic adhesive, a cyanoacrylate adhesive (e.g., methyl cyanoacrylate), and/or a modified structural polymer adhesive. According to some embodiments, the bonding material 203 may be used in combination with an activator, such as an anaerobic surface activator. Other arrangements and/or configurations of the bonding material 203 are within the scope of the present disclosure.

In some embodiments, the electrode ring 124 may have one or more sides exposed to the electric field 116. The electrode ring 124 may have a plurality of sides, such as a first side 204, a second side 206, a third side 208, and a fourth side 210. The first side 204 and the third side 208 may be configured to face the semiconductor wafer W and shape the electric field 116 with respect to the edge region 118 of the semiconductor wafer W. As set forth in greater detail herein, an intensity of the electric field 116 may vary with respect to a distance of a side of the electrode ring 124 from the semiconductor wafer W. A closer proximity to the semiconductor wafer W may provide an increased intensity of the electric field 116 and increase a deposition rate or an etch rate of the plasma P with respect to the edge region 118. The first side 204 may be provided in closer proximity to the semiconductor wafer W than the third side 208 and provide a greater intensity of the electric field 116 than the third side 208. Hence, an inner portion of the edge region 118 of the semiconductor wafer W may experience a greater deposition rate of material than an outer portion of the edge region 118. For example, if the first side 204 is 2 mm from a top surface of the semiconductor wafer W and the third side 208 is 3 mm from the top surface of the semiconductor wafer W, the deposition rate on the outer portion of the edge region 118 may be 10% to 50% less the deposition rate on the inner portion of the edge region 118.

In some embodiments, the electrode ring 124 may be configured to adjoin the first plasma electrode 110. For example, the fourth side 210 of the electrode ring 124 may adjoin an inner side of the first plasma electrode 110 such that the electrode ring 124 and the first plasma electrode 110 are electrically coupled. In this example, the first plasma electrode 110 may be coupled to ground and the electrical connector 160 may be selectively coupled to ground to reduce the resistivity of the electrode ring 124 and tune the electric field 116 toward the center of the semiconductor wafer W. In some embodiments, the electrode ring 124 is configured to be separated from the first plasma electrode 110. For example, the fourth side 210 of the electrode ring 124 may be separated from the first plasma electrode 110 or an outer side 212 of the dielectric ring 128 may adjoin the first plasma electrode 110. In some embodiments, the second side 206 of the electrode ring 124 is contiguous with the first side 204 and the third side 208, and perpendicular to the top surface of the semiconductor wafer W. When the second side 206 is perpendicular, material deposition in the edge region 118 of the semiconductor wafer W may be more precisely defined. For example, if an outer periphery of the semiconductor wafer W is aligned with the second side 206, material deposition may be more precisely defined at the outer periphery. In this example, the intensity of the electric field 116 may be increased at the outer periphery of the semiconductor wafer corresponding to the second side 206 of the electrode ring 124.

According to some embodiments, the sides of the electrode ring 124 may change the electric field 116 incident on the edge region 118 of the semiconductor wafer W. An increase in length of the first side 204 and the third side 208 facing the top surface of the semiconductor wafer W may increase the electric field 116 incident on the edge region 118 of the semiconductor wafer W. In some embodiments, the first side 204 of the electrode ring 124 may be between 0.25 mm and 4 mm, such as 3 mm. In some embodiments, the third side 208 may be between 0.25 mm and 4 mm, such as 1 mm. In some embodiments, the dielectric ring 128 may have a radius greater than or equal to 140 mm and less than or equal to 150 mm.

Figure 2B:
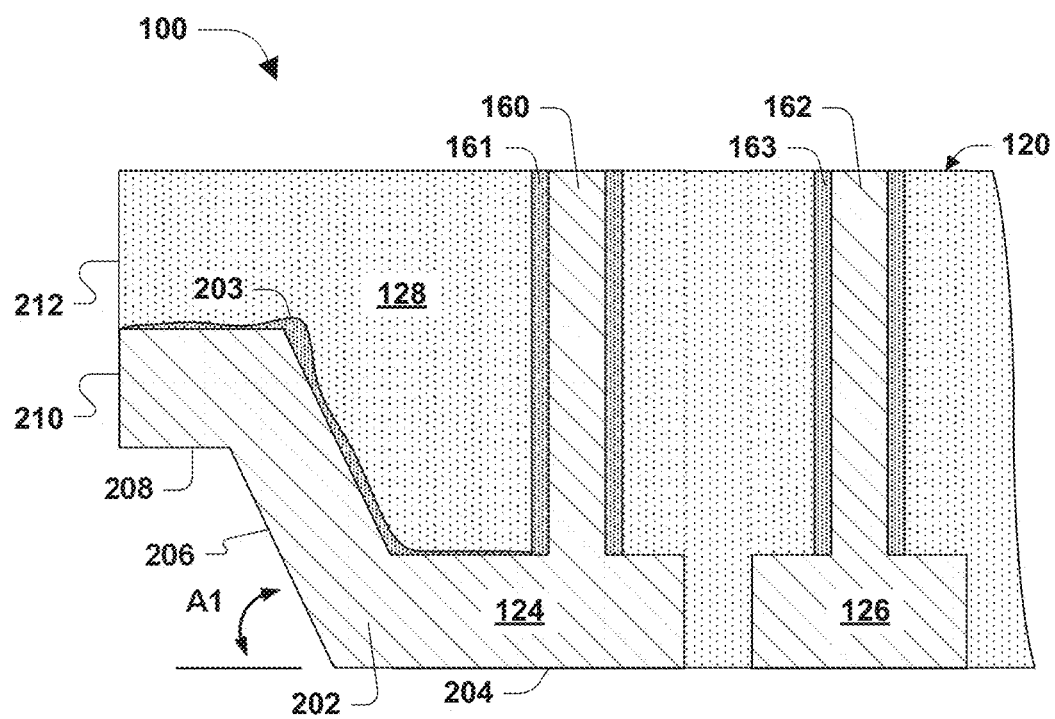

With reference to FIG. 2B and according to some embodiments, the implementation 100 may include the PEZ ring 120 configured as an upper PEZ ring above an upper surface of the semiconductor wafer W in the chamber 104 or as a lower PEZ ring below a lower surface of the semiconductor wafer W in the chamber 104. The embodiment of FIG. 2B differs from FIG. 2A in that the second side 206 is provided at an angle A1 with respect to the first side 204. The angle A1 may be between 30° and 90°, such as about 60°. The angle A1 provide material deposition in the edge region 118 of the semiconductor wafer W that is more contoured. For example, if the outer periphery of the semiconductor wafer W is aligned with a union of the second side 206 and the third side 208, the intensity of the electric field 116 may be linearly increased from the union of the second side 206 and the third side 208 to the union of the second side 206 and the first side 204, resulting in linearly increasing material deposition in the edge region 118 toward the center of the semiconductor wafer W.

Figure 2C:
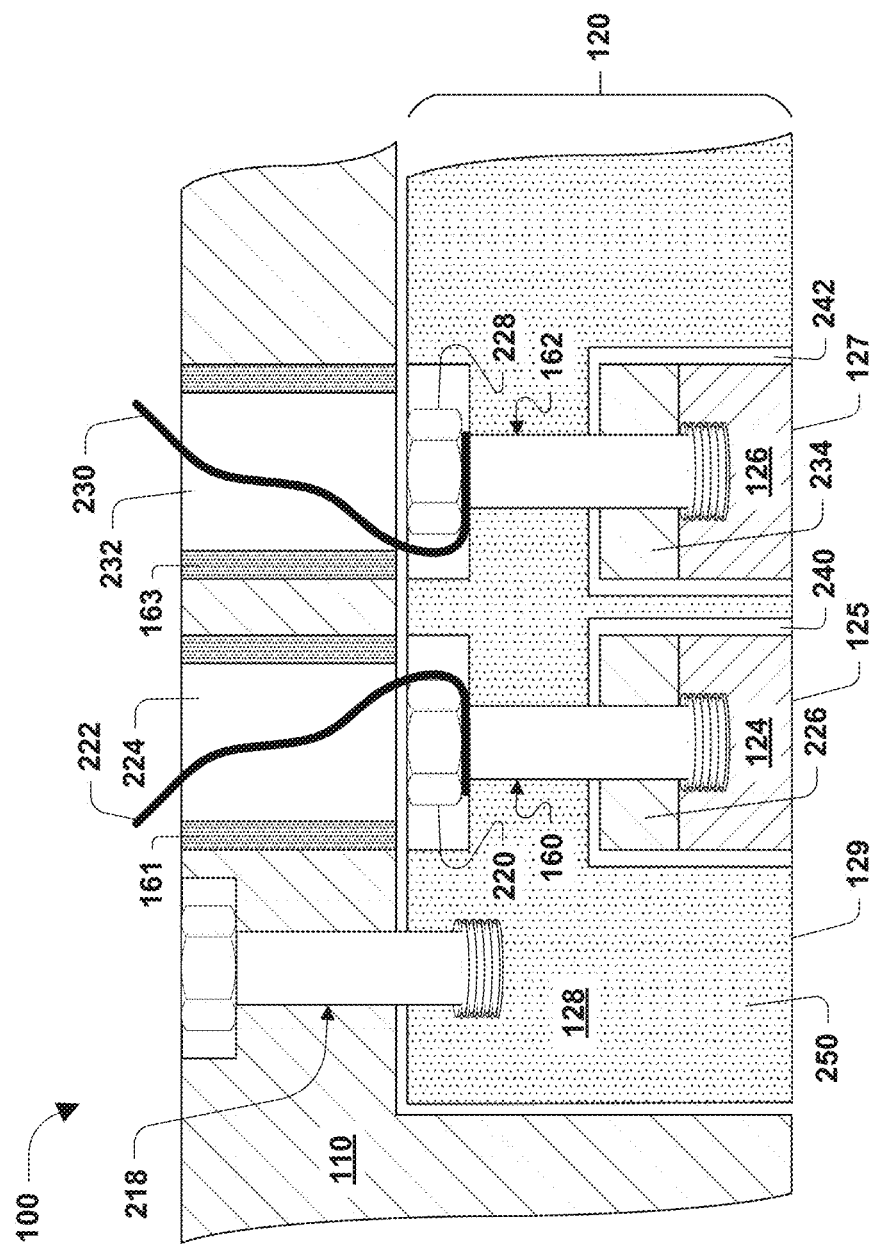

With reference to FIG. 2C and according to some embodiments, the implementation 100 may include the PEZ ring 120 configured as an upper PEZ ring above an upper surface of the semiconductor wafer W in the chamber 104 or as a lower PEZ ring below a lower surface of the semiconductor wafer W in the chamber 104. In some embodiments, the PEZ ring 120 may be fastened to the first plasma electrode 110 with a plurality of retention members, such as a retention bolt 218. In some embodiments, the electrode ring 124 may be fastened to the dielectric ring 128 with one or more retention members. In some embodiments, the electrical connector 160 may include a retention member, such as a first bolt 220. The first bolt 220 may be retained within a recess of the dielectric ring 128 and threaded into the electrode ring 124. The electrical connector 160 may include a first conductive lead 222 coupled to the first bolt 220 and coupled to the first switch 154 of the switch unit 152. In some embodiments, the first conductive lead 222 may pass through a first aperture 224 defined in the first plasma electrode 110 and may be insulated therefrom by the first insulating jacket 161. The electrode ring 124 may be adjusted with respect to the dielectric ring 128 with a circular spacer 226.

In some embodiments, the second electrical connector 162 may include a retention member, such as a second bolt 228. The second bolt 228 may be retained within a recess of the dielectric ring 128 and threaded into the second electrode ring 126. The second electrical connector 162 may include a second conductive lead 230 coupled to the second bolt 228 and coupled to the second switch 156 of the switch unit 152. In some embodiments, the second conductive lead 230 may pass through a second aperture 232 defined in the first plasma electrode 110 and may be insulated therefrom by the second insulating jacket 163. The second electrode ring 126 may be adjusted with respect to the dielectric ring 128 with a second circular spacer 234. In some embodiments, the circular spacer 226 and the second circular spacer 234 have the same vertical thickness. In some embodiments, the circular spacer 226 and the second circular spacer 234 have different vertical thicknesses to vary a distance from an adjoining electrode ring toward or away from a surface of the semiconductor wafer W. The circular spacer 226 may be configured to adjust a first facing surface 125 of the electrode ring 124 with respect to a facing surface 129 of the dielectric ring 128. The second circular spacer 234 may be configured to adjust a second facing surface 127 of the second electrode ring 126 with respect to the facing surface 129 of the dielectric ring 128. In some embodiments, the first facing surface 125 and/or the second facing surface 127 are coincident with the facing surface 129. In some embodiments, the first facing surface 125 and/or the second facing surface 127 are offset from the facing surface 129, such as protruding from or recessed from the facing surface 129.

According to some embodiments, the dielectric ring 128 defines or has a circular groove 240 configured to face the semiconductor wafer W in the chamber 104 of the plasma processing apparatus 102, and the electrode ring 124 may be configured to be received within the circular groove 240. In some embodiments, the dielectric ring 128 may define or have a second circular groove 242 configured to face the semiconductor wafer W in the chamber 104 of the plasma processing apparatus 102, and the second electrode ring 126 may be configured to be received within the second circular groove 242. In some embodiments, the circular spacer 226 is configured to be received within the circular groove 240 between the body 250 of the dielectric ring 128 and the electrode ring 124. In some embodiments, the second circular spacer 234 is configured to be received within the second circular groove 242 between the body 250 of the dielectric ring 128 and the second electrode ring 126. In some embodiments, the electrical connector 160 is electrically couplable between the electrode ring 124 and the voltage potential by passing through the body 250 of the dielectric ring 128 and the circular spacer 226. In some embodiments, the second electrical connector 162 is electrically couplable between the second electrode ring 126 and the voltage potential by passing through the body 250 of the dielectric ring 128 and the second circular spacer 234.

With reference to FIG. 2D and according to some embodiments, the implementation 100 may include the PEZ ring 120 configured as an upper PEZ ring above an upper surface of the semiconductor wafer W in the chamber 104 or as a lower PEZ ring below a lower surface of the semiconductor wafer W in the chamber 104. In some embodiments, a PEZ ring spacer 236 may be inserted between the PEZ ring 120 and the first plasma electrode 110 to move the PEZ ring 120 toward or away from a surface of the semiconductor wafer W. The PEZ ring spacer 236 may be configured to adjust the facing surface 129 of the dielectric ring 128 with respect to a plasma electrode facing surface 111 of the first plasma electrode 110. In some embodiments, the facing surface 129 is coincident with the plasma electrode facing surface 111. In some embodiments, the facing surface 129 is offset from the plasma electrode facing surface 111, such as protruding from or recessed from the plasma electrode facing surface 111.

In some embodiments, the electrode ring 124 and/or the second electrode ring 126 has a trapezoidal cross-sectional shape that mates with a corresponding trapezoidal groove defined or formed in the dielectric ring 128. When configured with the trapezoidal cross-sectional shape, the electrode ring 124 and/or the second electrode ring 126 may be seated more securely within a corresponding trapezoidal groove and may be fabricated with lower precision. Such lower precision may reduce costs associated with manufacture and/or replacement due to degradation from interaction with the plasma P. In some embodiments, the spacers (e.g., the circular spacer 226, the second circular spacer 234, or the PEZ ring spacer 236) may be a conductive material, an insulating material, or other material as set forth herein. Other arrangements and/or configurations of the PEZ ring 120, the electrode ring 124, and/or the second electrode ring 126 are within the scope of the present disclosure.

Figure 3A:
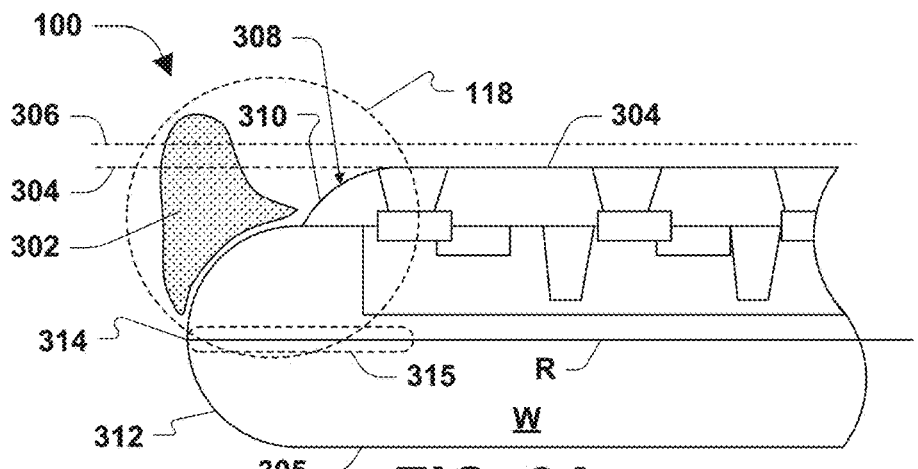
FIGS. 3A-3C illustrate an implementation of a tunable plasma exclusion zone for semiconductor fabrication, according to some embodiments.
Figure 3B:
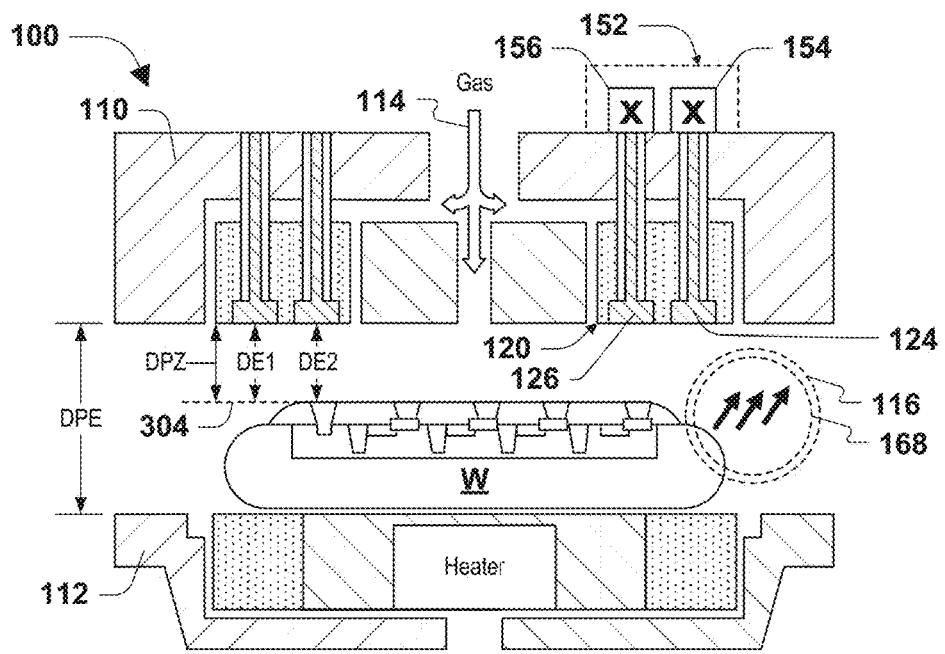
Figure 3C:
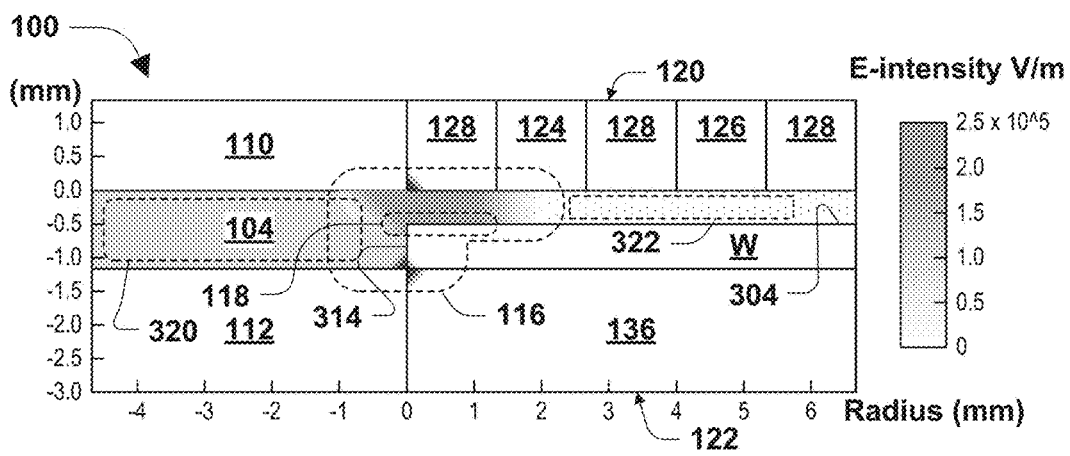

FIGS. 3A-3C illustrate an implementation 100 of a tunable plasma exclusion zone for semiconductor fabrication, according to some embodiments. FIG. 3A illustrates deposition of a dielectric material 302 about the edge region 118 of the semiconductor wafer W. FIG. 3B illustrates the field component 168 of the electric field 116 when the first switch 154 is turned OFF and the second switch 156 is turned OFF. FIG. 3C illustrates the intensity of the electric field 116 about the semiconductor wafer W. In some embodiments, the dielectric material 302 is deposited on the edge region 118 of the semiconductor wafer W from the plasma P.

With reference to FIG. 3A and according to some embodiments, a portion of the dielectric material 302 may be built up in the edge region 118 beyond a top surface 304 of the semiconductor wafer W. The line 306 indicates a portion of the dielectric material 302 that may be removed by processing the semiconductor wafer W. In some embodiments, the line 306 indicates removal of the dielectric material 302 in subsequent processing operations, such as CMP processing. In some embodiments, the line 306 indicates removal of the dielectric material 302 by etching the dielectric material 302 from the edge region 118 of the semiconductor wafer W with the plasma P. In some embodiments the dielectric material 302 may be deposited on a bevel edge 308 of the semiconductor wafer W. In some embodiments, the bevel edge 308 comprises a top bevel edge 310 and a bottom bevel edge 312. In some embodiments, the top bevel edge 310 extends from the top surface 304 to a side surface 314 of the semiconductor wafer W. In some embodiments, the bottom bevel edge 312 extends from the bottom surface 305 to the side surface 314 of the semiconductor wafer W. Deposition of the dielectric material 302 on the top bevel edge 310 is illustrated in FIG. 3A for clarity. In some embodiments, deposition of the dielectric material 302 is provided on the bottom bevel edge 312 and/or the side surface 314.

According to some embodiments and after some processing operations have been performed on the semiconductor wafer W, the top bevel edge 310 or the bottom bevel edge 312 may taper or roll-off across a portion 315 of a radius R of the semiconductor wafer W in the edge region 118 of the semiconductor wafer W. Such taper or roll-off may impede subsequent processing operations, such as bonding the semiconductor wafer W to another semiconductor wafer, also known as wafer on wafer bonding. In an example, if the top bevel edge 310 tapers across the portion 315 greater than about 10,000 angstroms (Å), wafer on wafer bonding may be impeded and the edge region 118 may be rebuilt through deposition of the dielectric material 302 by the plasma processing apparatus 102. In an example, if the top bevel edge 310 protrudes across the portion 315 greater than about 5,000 Å, such as greater than 6,000 Å or greater than 10,000 Å, subsequent CMP processing may be impeded and the edge region 118 may be reduced through etching of the dielectric material 302 by the plasma processing apparatus 102. The top bevel edge 310 may taper and/or protrude greatly across the portion 315 as a result of prior processing operations, such as with respect to the top surface 304 of the semiconductor wafer W. In some embodiments, the top bevel edge 310 may taper across the portion 315 between 0 Å and 100,000 Å over a distance between 1 mm and 10 mm, over a distance between 1 mm and 5 mm, or over a distance between 1 mm and 3 mm. The top bevel edge 310 may taper across the portion 315 between 0 Å and 90,000 Å over a distance between 0.5 mm and 1.0 mm. The top bevel edge 310 may taper across the portion 315 between 0 Å and 10,000 Å over a distance between 0.5 mm and 1.0 mm. The top bevel edge 310 may taper across the portion 315 between 0 Å and 100,000 Å over a distance between 0.5 mm and 5.0 mm. In some embodiments, the top bevel edge 310 may protrude across the portion 315 with similar dimensions to the taper set forth herein.

With reference to FIG. 3B and according to some embodiments, a distance DPE may be provided between the first plasma electrode 110 and the second plasma electrode 112. The distance DPE may vary to process semiconductor wafers having different thicknesses and/or to tune the electric field 116 about the edge region 118 of the semiconductor wafer W. In some embodiments, the distance DPE may vary between about 0.1 mm and 4.0 mm, between about 0.25 mm and 3.0 mm, or about 0.5 mm and 1.0 mm. In some embodiments, the intensity of the electric field 116 may increase about the edge region 118 of the semiconductor wafer W in proportion to the distance DPE, and increase a rate of deposition of the dielectric material 302. In some embodiments, the distance DPE may be changed by the drive unit 159 of the plasma processing apparatus 102 in response to a control signal output by the controller 158 of FIG. 1A.

According to some embodiments, a distance DPZ may be provided between the PEZ ring 120 and the top surface 304 of the semiconductor wafer W. The distance DPZ may vary to process semiconductor wafers having different thicknesses and/or to tune the electric field 116 about the edge region 118 of the semiconductor wafer W. In some embodiments, the distance DPZ may vary between about 0.1 mm and 2.0 mm, between about 0.2 mm and 1.0 mm, or between about 0.3 mm and 0.75 mm, such as 0.5 mm. In some embodiments, the intensity of the electric field 116 may increase about the edge region 118 of the semiconductor wafer W in proportion to the distance DPZ, and increase a rate of deposition of the dielectric material 302. In some embodiments, the distance DPE may be changed by the drive unit 159 of the plasma processing apparatus 102 in response to a control signal output by the controller 158 of FIG. 1A. In some embodiments, the distance DPE may be changed by insertion of the PEZ ring spacer 236 of FIG. 2D.

According to some embodiments, a distance DE1 may be provided between the electrode ring 124 and the top surface 304 of the semiconductor wafer W. The distance DE1 may vary to process semiconductor wafers having different thicknesses and/or to tune the first tuning component 170 of the electric field 116 about the edge region 118 of the semiconductor wafer W. The distance DE1 may vary between about 0.1 mm and 2.0 mm, between about 0.2 mm and 1.0 mm, or between about 0.3 mm and 0.75 mm, such as 0.5 mm. In some embodiments, the intensity of the first tuning component 170 of the electric field 116 may increase about the edge region 118 of the semiconductor wafer W in proportion to the distance DE1, and increase a rate of deposition of the dielectric material 302. The distance DE1 may be changed by the drive unit 159 of the plasma processing apparatus 102 in response to a control signal output by the controller 158 of FIG. 1A, insertion of the PEZ ring spacer 236 of FIG. 2D, and/or insertion of the circular spacer 226 of FIG. 2C.

According to some embodiments, a distance DE2 may be provided between the second electrode ring 126 and the top surface 304 of the semiconductor wafer W. The distance DE2 may vary to process semiconductor wafers having different thicknesses and/or to tune the second tuning component 172 of the electric field 116 about the edge region 118 of the semiconductor wafer W. The distance DE2 may vary between about 0.1 mm and 2.0 mm, between about 0.2 mm and 1.0 mm, or between about 0.3 mm and 0.75 mm, such as 0.5 mm. In some embodiments, the intensity of the second tuning component 172 of the electric field 116 may increase about the edge region 118 of the semiconductor wafer W in proportion to the distance DE2, and increase a rate of deposition of the dielectric material 302. The distance DE2 may be changed by the drive unit 159 of the plasma processing apparatus 102 in response to a control signal output by the controller 158 of FIG. 1A, insertion of the PEZ ring spacer 236 of FIG. 2D, and/or insertion of the second circular spacer 234 of FIG. 2C.

With reference to FIG. 3C and according to some embodiments, the intensity of the electric field 116 may vary about the top surface 304 and the side surface 314 of the semiconductor wafer W within the chamber 104 to interact with the edge region 118 when the first switch 154 is turned OFF and the second switch 156 is turned OFF. FIG. 3C illustrates the semiconductor wafer W schematically to better illustrate the electric field 116, which includes the field component 168. In some embodiments, the electric field 116 is provided within the chamber 104 and interacts with dielectric components of the plasma processing apparatus 102, such as the dielectric ring 128 of the PEZ ring 120 and the second dielectric ring 136 of the second PEZ ring 122. In some embodiments, the intensity of the electric field 116 is more concentrated about the edge region 118 of the semiconductor wafer W, which is exposed in the chamber 104 between the first plasma electrode 110 and the second plasma electrode 112. For example, the edge region 118 may be provided with an electric field intensity between about $2.25 \times 10^5$ V/m and $2.5 \times 10^5$ V/m. In some embodiments, the intensity of the electric field 116 is less concentrated in a plasma electrode region 320 of the chamber 104 than the edge region 118, such as between the first plasma electrode 110 and the second plasma electrode 112. For example, the plasma electrode region 320 may be provided with an electric field intensity between about $1.75 \times 10^5$ V/m and $2.0 \times 10^5$ V/m. In some embodiments, the intensity of the electric field 116 is less concentrated in an inner chamber region 322 of the chamber 104 than the edge region 118 or the plasma electrode region 320, such as between the PEZ ring 120 and the second PEZ ring 122 and inward from the edge region 118. For example, the inner chamber region 322 may be provided with an electric field intensity between about $0.5 \times 10^5$ V/m and $0.75 \times 10^5$ V/m. In some embodiments, the inner chamber region 322 may include a region between the top plate 130 and the stage 134, as illustrated in FIG. 1A. In some embodiments, the inner chamber region 322 may include a portion of the chamber 104 between the PEZ ring 120 and the semiconductor wafer W. In some embodiments, the inner chamber region 322 may include a portion of the chamber 104 between a portion of the dielectric ring 128 and the semiconductor wafer W. Other arrangements and/or configurations of the electric field 116 within the chamber 104 are within the scope of the present disclosure.

Figure 4A:
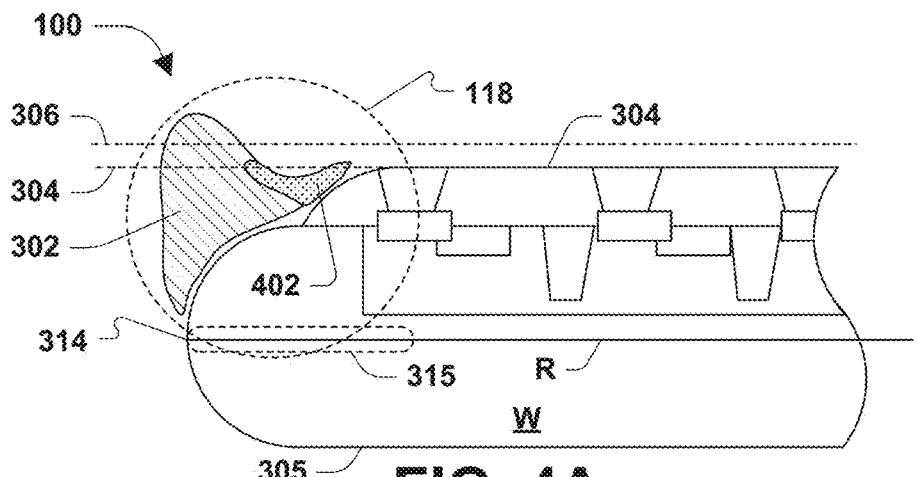
FIGS. 4A-4C illustrate an implementation of a tunable plasma exclusion zone for semiconductor fabrication, according to some embodiments.
Figure 4B:
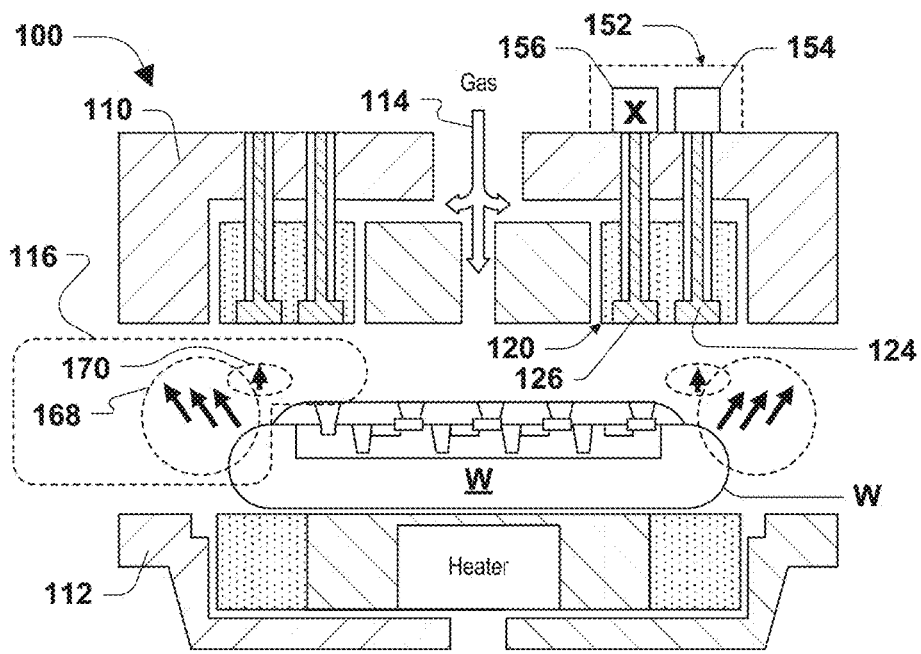
Figure 4C:
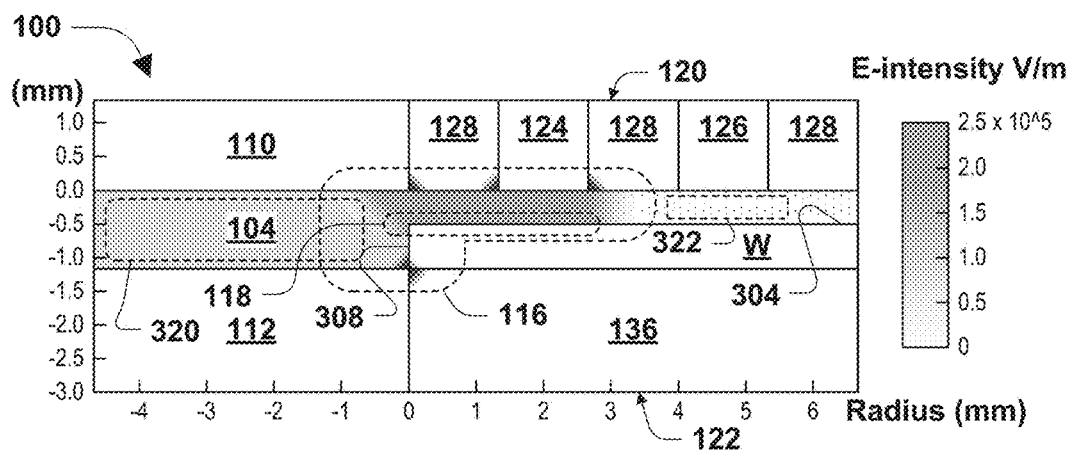

FIGS. 4A-4C illustrate an implementation of a tunable plasma exclusion zone for semiconductor fabrication, according to some embodiments. With reference to FIG. 4A and according to some embodiments, deposition of a second dielectric material 402 may be provided about the edge region 118 of the semiconductor wafer W. In some embodiments, the second dielectric material 402 may be a dielectric material that is deposited on the edge region 118 of the semiconductor wafer W from the plasma P. In some embodiments, the second dielectric material 402 may be contiguous with and/or continuously formed with the dielectric material 302. In some embodiments, a portion of the second dielectric material 402 may be built up in the edge region 118 beyond the top surface 304 of the semiconductor wafer W. The second dielectric material 402 may enhance subsequent processing of the semiconductor wafer W through enhanced deposition in the edge region 118. In some embodiments the second dielectric material 402 is deposited on the bevel edge 308 of the semiconductor wafer W illustrated in FIG. 3A. With reference to FIG. 4B and according to some embodiments, the field component 168 and the first tuning component 170 of the electric field 116 may be provided when the first switch 154 is turned ON and the second switch 156 is turned OFF.

With reference to FIG. 4C and according to some embodiments, the intensity of the electric field 116 may vary about the top surface 304 and the side surface 314 of the semiconductor wafer W within the chamber 104 to interact with the edge region 118 when the first switch 154 is turned ON. In some embodiments, the electric field 116 may interact with dielectric components of the plasma processing apparatus 102, such as the dielectric ring 128 of the PEZ ring 120, which are exposed to the chamber 104 about adjacent sides of the electrode ring 124. In some embodiments, the intensity of the electric field 116 may be enhanced about the edge region 118 of the semiconductor wafer W inward toward the center of the semiconductor wafer, between the first plasma electrode 110 and the second plasma electrode 112, and between the electrode ring 124 and the second plasma electrode 112. For example, the edge region 118 may extend from an outer edge of the PEZ ring 120 inward toward the center of the semiconductor wafer W past the electrode ring 124. With the first switch 154 is turned ON, the edge region 118 may be provided with an electric field intensity between about $2.25 \times 10^5$ V/m and $2.5 \times 10^5$ V/m. In response to engagement of the first switch 154, the first tuning component 170 of the electric field 116 may be provided inward, in the inner chamber region 322, toward the center of the semiconductor wafer W. In some embodiments, the inner chamber region 322 may include a portion of the chamber 104 between the second electrode ring 126 and the semiconductor wafer W.

Figure 5A:
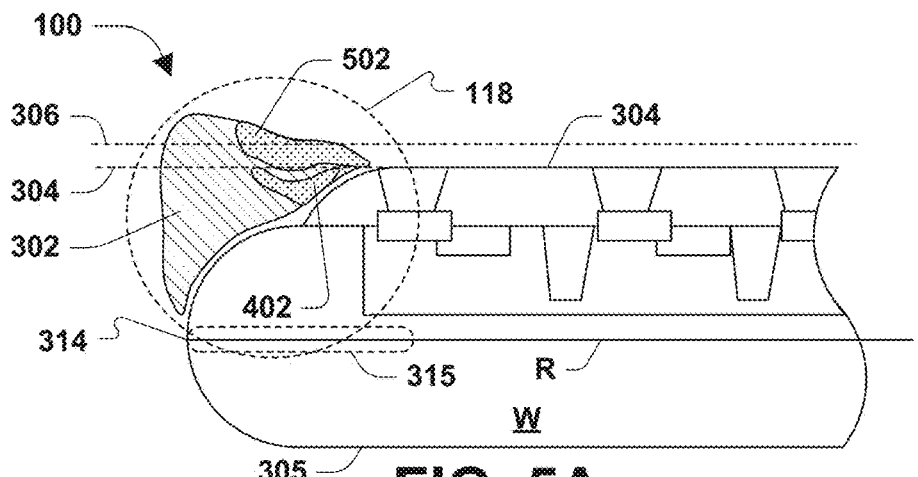
FIGS. 5A-5E illustrate an implementation of a tunable plasma exclusion zone for semiconductor fabrication, according to some embodiments.
Figure 5B:
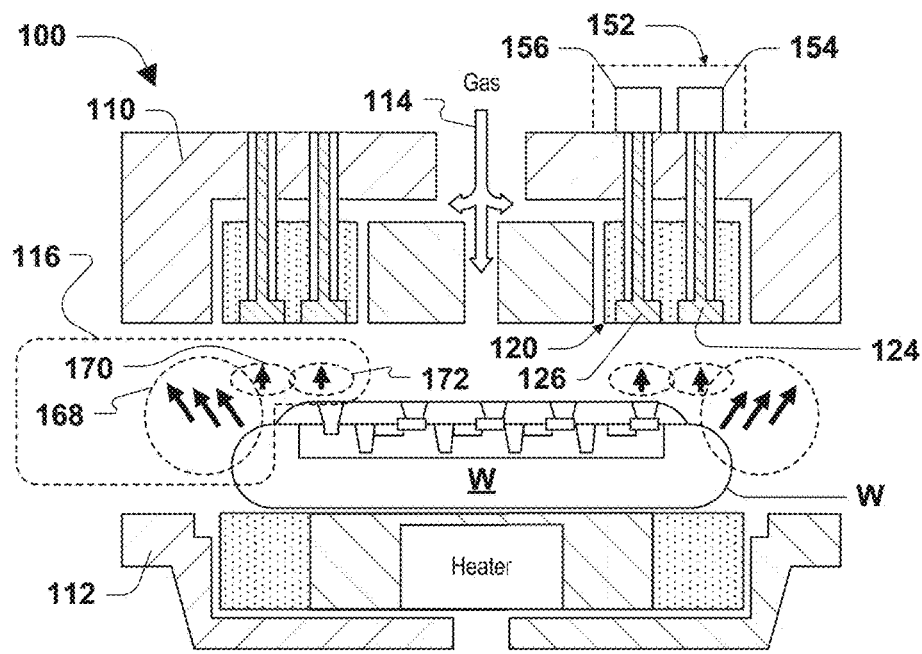

FIGS. 5A-5E illustrate an implementation of a tunable plasma exclusion zone for semiconductor fabrication, according to some embodiments. With reference to FIG. 5A and according to some embodiments, deposition of a third dielectric material 502 may be provided about the edge region 118 of the semiconductor wafer W. In some embodiments, the third dielectric material 502 may be a dielectric material that is deposited on the edge region 118 of the semiconductor wafer W from the plasma P. In some embodiments, the third dielectric material 502 may be contiguous with and/or continuously formed with the dielectric material 302 or the second dielectric material 402. The third dielectric material 502 may be built up in the edge region 118 beyond the top surface 304 of the semiconductor wafer W. The third dielectric material 502 may enhance subsequent processing of the semiconductor wafer W through enhanced deposition in the edge region 118. In some embodiments, the third dielectric material 502 may completely fill the bevel edge 308 as illustrated in FIG. 3A. With reference to FIG. 5B and according to some embodiments, the field component 168, the first tuning component 170, and the second tuning component 172 of the electric field 116 may be provided when the first switch 154 is turned ON and the second switch 156 is turned ON.

Figure 5C:
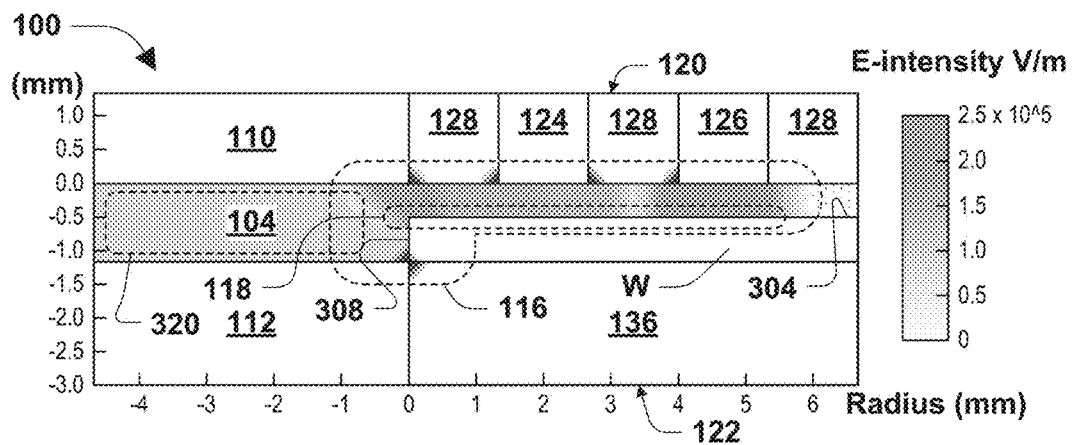

With reference to FIG. 5C and according to some embodiments, the intensity of the electric field 116 may vary about the top surface 304 and the side surface 314 of the semiconductor wafer W within the chamber 104 to interact with the edge region 118 when the first switch 154 is turned ON and the second switch 156 is turned ON. In some embodiments, the electric field 116 may interact with dielectric components of the plasma processing apparatus 102, such as the dielectric ring 128 of the PEZ ring 120, which are exposed to the chamber 104 about adjacent sides of the second electrode ring 126. In some embodiments, the intensity of the electric field 116 may be enhanced about the edge region 118 of the semiconductor wafer W inward toward the center of the semiconductor wafer, between the first plasma electrode 110 and the second plasma electrode 112, between the electrode ring 124 and the second plasma electrode 112, and between the second electrode ring 126 and the second plasma electrode. For example, the edge region 118 may extend from an outer edge of the PEZ ring 120 inward toward the center of the semiconductor wafer W, past the electrode ring 124, and past the second electrode ring 126. With the first switch 154 turned ON and the second switch turned ON, the edge region 118 may be provided with an electric field intensity between about $2.25 \times 10^5$ V/m and $2.5 \times 10^5$ V/m. In response to engagement of the first switch 154 and the second switch 156, the first tuning component 170 and the second tuning component 172 of the electric field 116 may be provided inward, in the inner chamber region 322, toward the center of the semiconductor wafer W. In some embodiments, the inner chamber region 322 may include a portion of the chamber 104 between the top plate 130 and the stage 134, as illustrated in FIG. 1A. In some embodiments, the inner chamber region 322 may include a portion of the chamber 104 between a portion of the dielectric ring 128 and the semiconductor wafer W. Other arrangements and/or configurations for changing the electric field intensity are within the scope of the present disclosure.

Figure 5D:
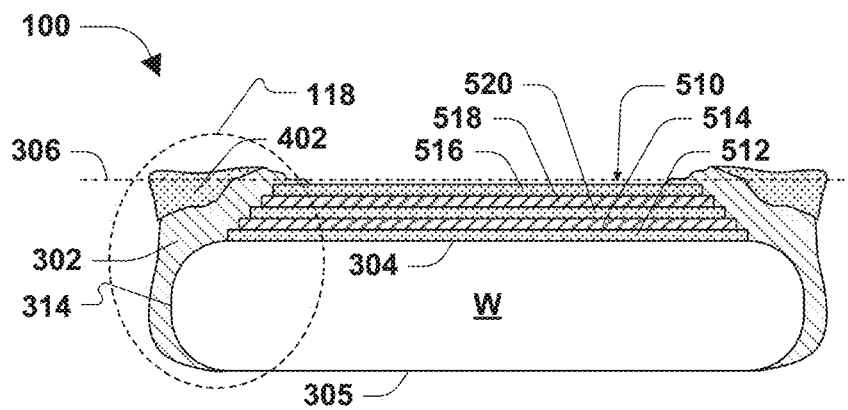

With reference to FIG. 5D and according to some embodiments, a portion of the dielectric material 302 may be built up in the edge region 118 beyond the top surface 304 of the semiconductor wafer W. The line 306 indicates the portion of the dielectric material 302 that may be removed by processing the semiconductor wafer W. In some embodiments, the line 306 indicates removal of the dielectric material 302 in subsequent processing operations, such as CMP processing. In some embodiments, the top surface 304 of the semiconductor wafer W may form a foundation for supporting a plurality of layers 510 that may be built thereon. In some embodiments, the dielectric material 302 may be built up in the edge region 118 such that a portion of the dielectric material 302 covers a portion of the side surface 314 of the semiconductor wafer W and/or a portion of the plurality of layers 510. In some embodiments, the dielectric material 302 may be built up in the edge region 118 such that a portion of the dielectric material 302 covers all of the side surface 314 of the semiconductor wafer W. In some embodiments, the dielectric material 302 may be built up in the edge region 118 such that a portion of the dielectric material 302 covers a side surface of the plurality of layers 510. In some embodiments, the second dielectric material 402 may be deposited on the edge region 118 of the semiconductor wafer W adjacent to the dielectric material 302. In some embodiments, the dielectric material 302 and the second dielectric material 402 are formed to protrude above the line 306, indicating the portion of material to be removed by subsequent processing of the semiconductor wafer W.

In some embodiments, the plurality of layers 510 may form integrated circuits including field-effect transistors (FETs), such as complementary-metal-oxide-semiconductors (CMOSs). In some embodiments, the plurality of layers 510 may form a type of component that has been processed or a type of component in stages of being processed (e.g., a transistor, a p-n junction, a gate electrode, etc.). In some embodiments, the plurality of layers 510 may include a first layer 512, a second layer 514, a third layer 516, a fourth layer 518, and/or a fifth layer 520. For example, the first layer 512 may be an oxide layer, the second layer 514 may be a doped layer (e.g., n-doped, p-doped, etc.), the third layer 516 may be a metal layer, the fourth layer 518 may be a doped layer, or the fifth layer may be an oxide layer. Other arrangements and/or configurations of the plurality of layers 510 are within the scope of the present disclosure.

Figure 5E:
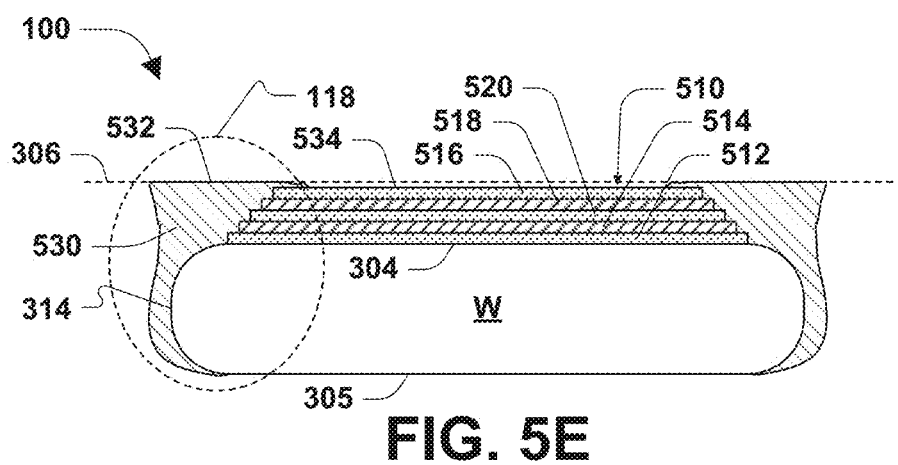

With reference to FIG. 5E and according to some embodiments, the dielectric material 302 and the second dielectric material 402 of FIG. 5D may form a unified dielectric material 530. In some embodiments, a portion of the unified dielectric material 530 protruding above the line 306 may be removed by subsequent processing, such as through CMP planarization, as set forth in greater detail herein. In some embodiments, the portion of the unified dielectric material 530 protruding above the line 306 may be removed such that a top surface 532 of the unified dielectric material 530 is above a top surface 534 of the plurality of layers 510. Other arrangements and/or configurations of the unified dielectric material 530 and/or the plurality of layers 510 are within the scope of the present disclosure.

Figure 6A:
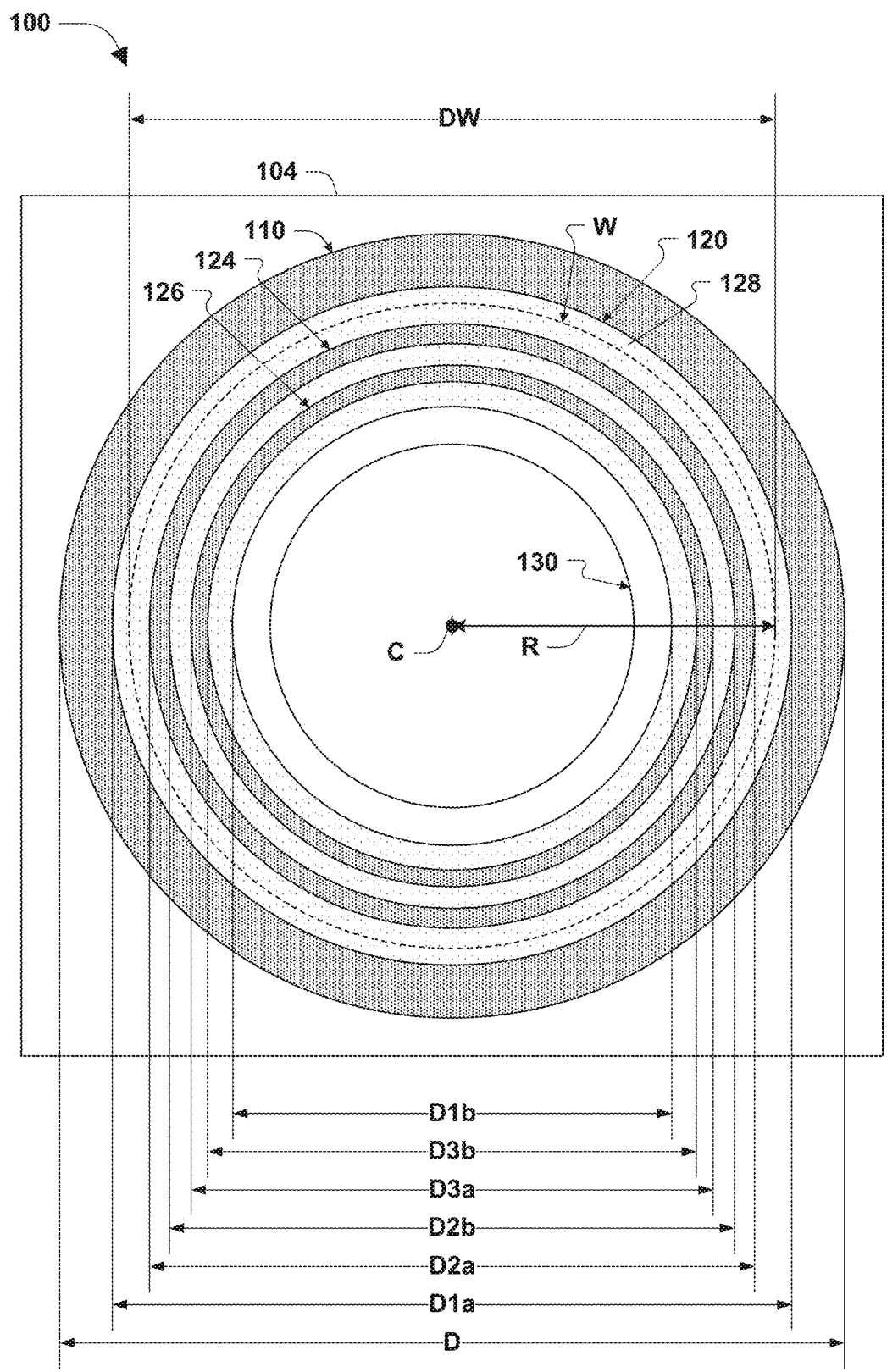
FIGS. 6A-6B illustrate an implementation of a plasma exclusion zone ring, according to some embodiments.
Figure 6B:
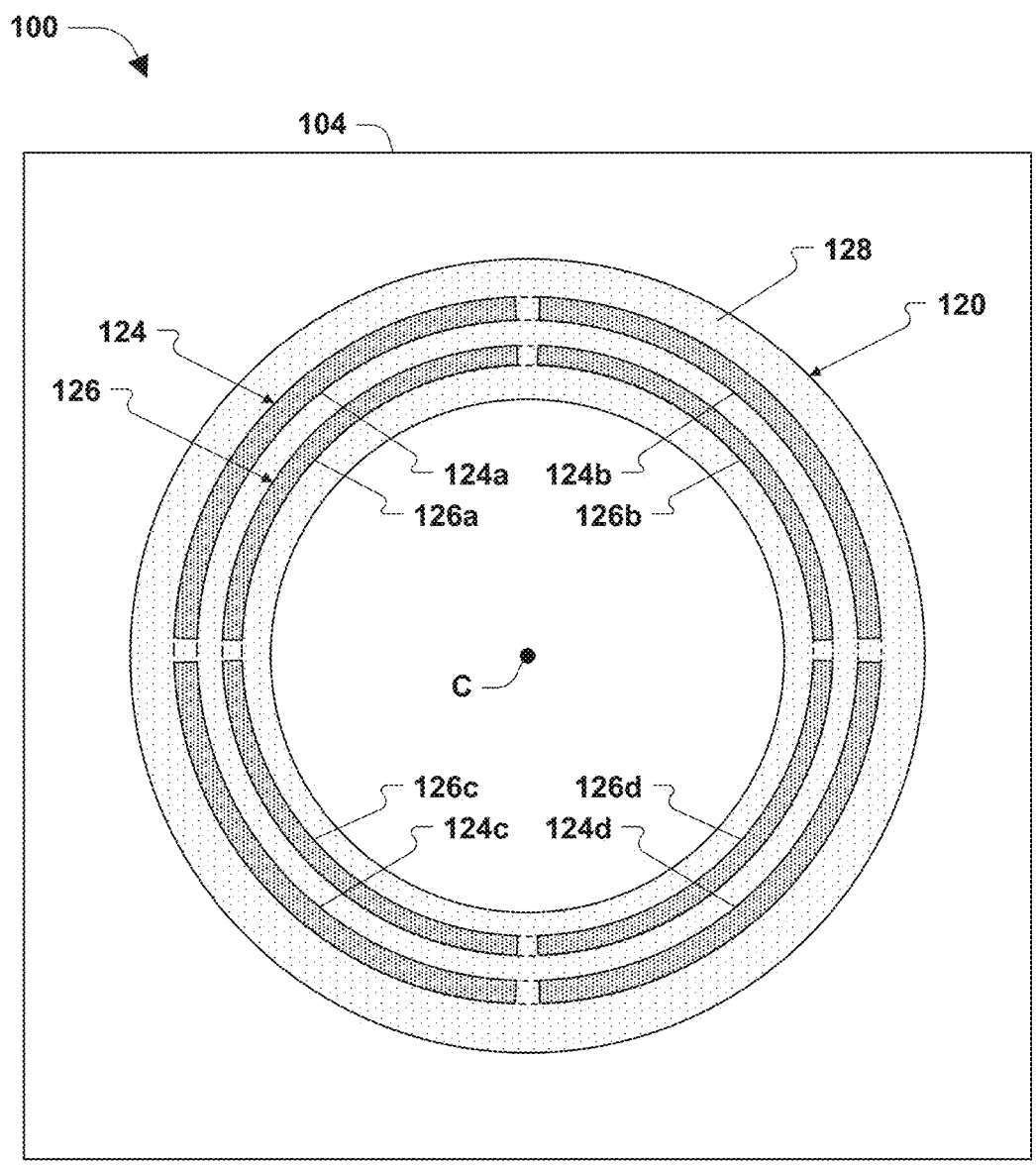

FIGS. 6A-6B illustrate an implementation 100 of a plasma exclusion zone ring, according to some embodiments. With reference to FIG. 6A and in some embodiments, the semiconductor wafer W has a radius R, a center C and a semiconductor wafer diameter DW. In some embodiments, the PEZ ring 120 includes the dielectric ring 128. The PEZ ring 120 may be configured to be removably affixed in the chamber 104 of the plasma processing apparatus 102. In some embodiments, the PEZ ring 120 may be removably affixed at the distance DPZ from the edge region 118 of the semiconductor wafer W in the chamber 104. The dielectric ring 128 may be configured to interact with the electric field 116 that directs the plasma P within the chamber 104 toward the edge region 118 of the semiconductor wafer W. In some embodiments, the first plasma electrode 110 may be configured as a ring having an outer diameter D and encircling the semiconductor wafer W within the chamber 104.

According to some embodiments, the PEZ ring 120 may be removably affixed to the first plasma electrode 110. In some embodiments, the PEZ ring 120 has an outer PEZ ring diameter D1$a$ and an inner PEZ ring diameter D1$b$. In some embodiments, the outer PEZ ring diameter D1$a$ may be less than the outer diameter D of the first plasma electrode 110. In some embodiments, the dielectric ring 128 may have an outer dielectric ring diameter that is the same as the outer PEZ ring diameter D1$a$. In some embodiments, the dielectric ring 128 may have an inner dielectric ring diameter that is the same as the inner PEZ ring diameter D1$b$. In some embodiments, the dielectric ring 128 may have a radius greater than or equal to 140 mm and less than or equal to 150 mm. The electrode ring 124 has an outer electrode ring diameter D2$a$ and an inner electrode ring diameter D2$b$. The second electrode ring 126 has an outer second electrode ring diameter D3$a$ and an inner second electrode ring diameter D3$b$. In some embodiments, the electrode ring 124 is provided within the chamber 104 of the plasma processing apparatus 102 such that the electrode ring 124 has the inner electrode ring diameter D2$b$ less than the outer PEZ ring diameter D1$a$ of the PEZ ring 120.

According to some embodiments, the electrode ring 124 is fastened to the dielectric ring 128 and has the inner electrode ring diameter D2$b$ less than the outer dielectric ring diameter of the dielectric ring 128. In some embodiments, the electrode ring 124 may be configured to face the edge region 118 of the semiconductor wafer W in the chamber 104 of the plasma processing apparatus 102, as illustrated in FIG. 1A, and may be electrically couplable to a voltage potential provided by the voltage potential unit 145 to interact with the electric field 116. In some embodiments, the PEZ ring 120 may be configured to at least partially exclude the plasma P within the chamber 104 from interaction with the semiconductor wafer W. In some embodiments, the inner electrode ring diameter D2$b$ is less than the semiconductor wafer diameter DW of the semiconductor wafer W and the electrode ring 124 is electrically couplable to the voltage potential to tune the plasma P toward the center C of the semiconductor wafer W. In some embodiments, the second electrode ring 126 is fastened to the dielectric ring 128 and has the outer second electrode ring diameter D3$a$ less than the inner electrode ring diameter D2$b$ of the electrode ring 124. In some embodiments, the second electrode ring 126 may be configured to face the semiconductor wafer W in the chamber 104 of the plasma processing apparatus 102 and may be electrically couplable to a second voltage potential to interact with the electric field 116. In some embodiments, the PEZ ring 120 may be configured within a processing chamber, such as the chamber 104 of the plasma processing apparatus 102 (FIGS. 1A and 1B), to tune the plasma P toward or away from the center C of the semiconductor wafer W according to a use case (e.g., BvD, BvE, a combination of BvD and BvE, etc.).

With reference to FIG. 6B and according to some embodiments, the PEZ ring 120 may include the dielectric ring 128 configured to be removably affixed in the chamber 104 of the plasma processing apparatus 102. In some embodiments, the electrode ring 124 and the second electrode ring 126 may be fastened to the dielectric ring 128 and connected to a voltage potential by the switch unit 152. In some embodiments, the electrode ring 124 may include a plurality of annular segments 124a-n. In some embodiments, the plurality of annular segments 124a-n includes a first annular segment 124a fastened to the dielectric ring 128 and electrically coupled to an electrical connector. An example electrical connector is the electrical connector 160 of FIG. 2C. The plurality of annular segments 124a-n may include a second annular segment 124b, a third annular segment 124c, and a fourth annular segment 124d respectively electrically coupled to electrical connectors passing through the body 250 of the dielectric ring 128. The second electrode ring 126 may include a second plurality of annular segments 126a-n. In some embodiments, the second plurality of annular segments 126a-n includes annular segments 126a-d, as illustrated in FIG. 6B. In some embodiments, annular segments of an electrode ring may be contiguous or may be separated at a distance that permits the electric field 116 to flow between the electrodes. For example, with an electric field intensity at about $2.5 \times 10^5$ V/m in the edge region 118 of the semiconductor wafer W, the annular segments of an electrode ring may be spaced between 0 mm and 2.0 mm, such as 1.0 mm.

According to some embodiments, the number of annular segments of an electrode ring may vary significantly. For example, the number of annular segments of an electrode ring may be 4, 8, 16, 32, 64, 128, 360, etc. In some embodiments, the annular segments may be configured as point electrodes that may be electrically coupled individually or in groups to a voltage potential by the switch unit 152. For example, the annular segments of an electrode ring may be configured as 360 point electrodes respectively electrically coupled to a voltage potential by the switch unit 152. In some embodiments, the annular segments may be grouped in sections, such as sections corresponding to halves or quarters of the semiconductor wafer W. The switch unit 152 may selectively couple or decouple each of the annular segments of an electrode ring to a voltage potential provided by the voltage potential unit 145 to tune the plasma P toward or away from the center C of the semiconductor wafer W. In some embodiments, the switch unit 152 may selectively couple or decouple each of the annular segments of an electrode ring to a voltage potential to direct the plasma P with respect to the edge region 118 of the semiconductor wafer W. In some embodiments, the switch unit 152 may selectively couple or decouple each of the annular segments of an electrode ring to the same voltage potential and tune the plasma P by selectively turning ON or OFF one or more annular segments. In some embodiments, the switch unit 152 may selectively couple or decouple each of the annular segments of an electrode ring to different voltage potentials provided by the voltage potential unit 145. In some embodiments, the switch unit 152 may selectively couple or decouple each of the annular segments of an electrode ring to a fixed voltage potential, such as ground, or a variable voltage potential set by the voltage potential unit 145, such as between 0 and 100 V. In some embodiments, the switch unit 152 may selectively couple or decouple each of the annular segments of an electrode ring to ground, the bias voltage 164, or the frequency generator 142.

According to some embodiments, by selectively coupling or decoupling one or more annular segments and/or sections of annular segments of an electrode ring, the plasma processing apparatus 102 may compensate for uneven degradation of components resulting from operation of the plasma P within the chamber 104. For example, the first plasma electrode 110 and/or the second plasma electrode 112 may be configured as ring electrodes and be subject to uneven degradation about a section thereof from the plasma P. In this example, one or more annular segments may be engaged by the switch unit 152 to increase the electric field 116 in such degraded sections. In some embodiments, by selectively coupling or decoupling one or more annular segments and/or sections of annular segments, the plasma processing apparatus 102 may compensate for and direct the plasma P with respect to uneven sections of the semiconductor wafer W, such as quarters of the semiconductor wafer W, halves of the semiconductor wafer W, or other sections of the semiconductor wafer W. Other arrangements and/or configurations of the electrode ring 124 and/or the second electrode ring 126 configured as a plurality of annular segments are within the scope of the present disclosure.

Figure 7:
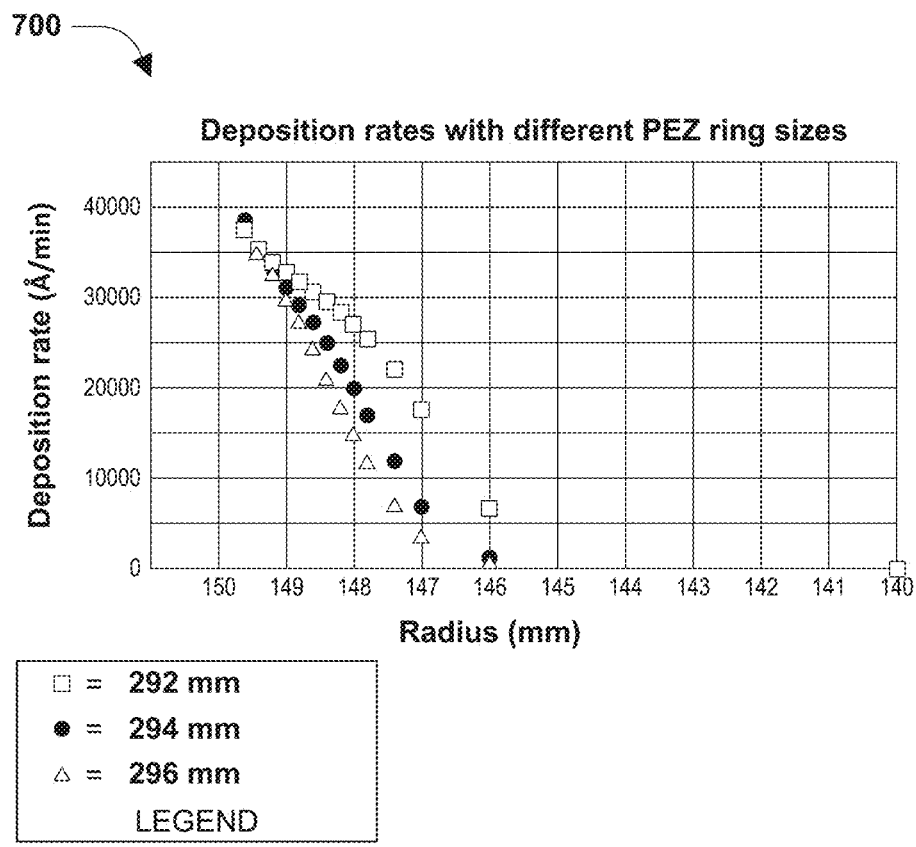
FIG. 7 illustrates a graph of deposition rates with different PEZ ring sizes, according to some embodiments.

FIG. 7 illustrates a graph 700 of deposition rates with different PEZ ring sizes, according to some embodiments. The graph 700 illustrates deposition rates of the dielectric material 302 in Å/m on the semiconductor wafer W corresponding to PEZ ring sizes of 292 mm, 294 mm, and 296 mm. For example, a PEZ ring size of 292 mm may provide a deposition rate that varies from about 40,000 Å/m to 0 Å/m across the radius R of about 10 mm of the semiconductor wafer W. A PEZ ring size of 294 mm may provide a deposition rate that varies from about 40,000 Å/m to 0 Å/m across the radius R of about 4 mm with a greater slope than a 292 mm PEZ ring. A PEZ ring size of 296 mm may provide a deposition rate that varies from 40,000 Å/m to 0 Å/m across the radius R of about 4 mm with a greater slope than a 294 mm PEZ ring. In some embodiments, by turning the first switch 154 OFF and the second switch 156 OFF, the PEZ ring 120 may be equivalent to a 196 mm PEZ ring. In some embodiments, by turning the first switch 154 ON and the second switch 156 OFF, the PEZ ring 120 may be equivalent to a 194 mm PEZ ring. In some embodiments, by turning the first switch 154 ON and the second switch 156 ON, the PEZ ring 120 may be equivalent to a 192 mm PEZ ring. In some embodiments, the plasma processing apparatus 102 may electrically couple or decouple the electrode ring 124 or the second electrode ring 126 from the voltage potential to provide an equivalent PEZ ring size. In an example, the plasma processing apparatus 102 may change an equivalent 294 mm PEZ ring to an equivalent 296 mm PEZ ring by electrically decoupling the electrode ring 124 from the voltage potential. In this example, a deposition rate of the dielectric material 302 on the edge region 118 of the semiconductor wafer W may be decreased. In an example, the plasma processing apparatus 102 may change an equivalent 294 mm PEZ ring to an equivalent 292 mm PEZ ring by electrically coupling the second electrode ring 126, fastened to the dielectric ring 128 of the PEZ ring 120, to a second voltage potential, through the switch unit 152, to increase a deposition rate of the dielectric material 302 on the edge region 118 of the semiconductor wafer W. Other arrangements and/or configurations for changing the deposition rate of the dielectric material 302 are within the scope of the present disclosure.

Figure 8:
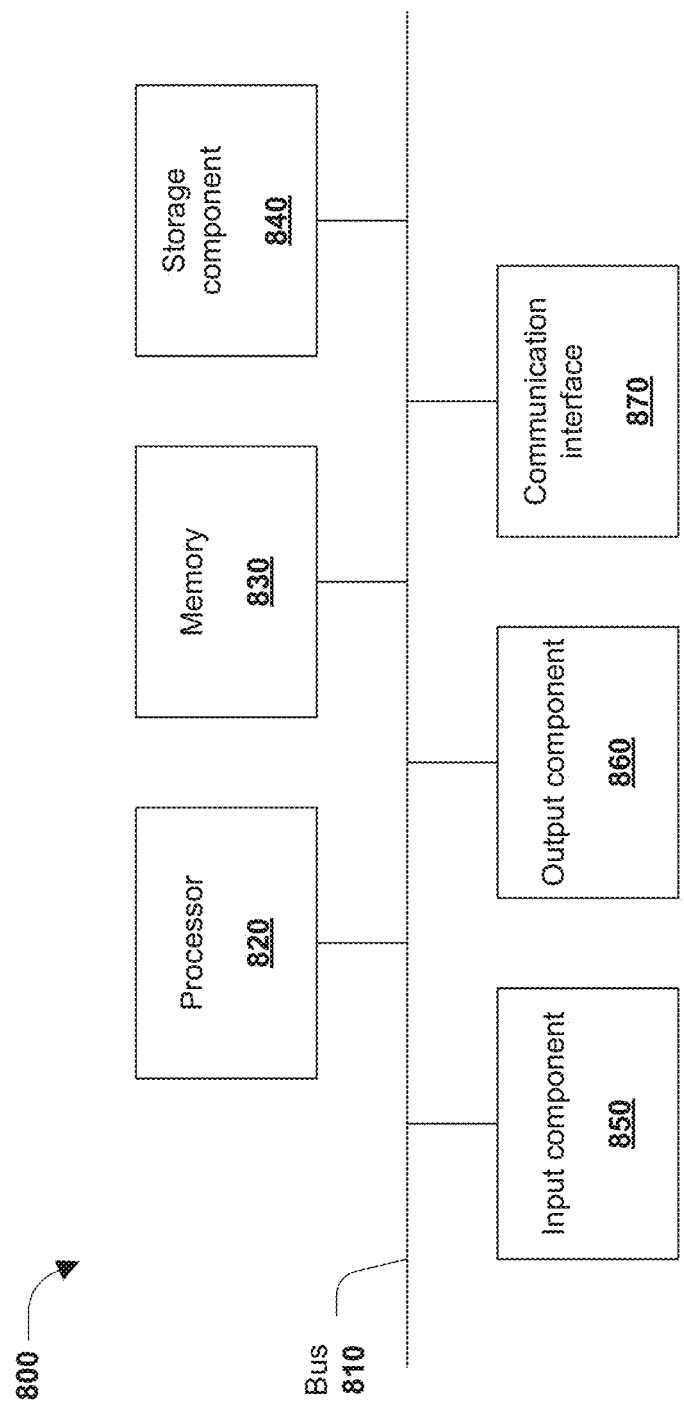
FIG. 8 illustrates example components of a device, according to some embodiments.

FIG. 8 illustrates example components of a device 800, according to some embodiments. According to some embodiments, the device 800 may correspond to the controller 158. As illustrated in FIG. 8, the device 800 may include a bus 810, a processor 820, a memory 830, a storage component 840, an input component 850, an output component 860, and a communication interface 870. The bus 810 may include a component that permits communication among the components of the device 800. The processor 820 may be implemented in hardware, firmware, or a combination of hardware and software. The processor 820 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), another type of processing component, or a combination thereof. In some implementations, the processor 820 includes one or more processors capable of being programmed to perform a function. The memory 830 may include a random access memory (RAM), a read only memory (ROM), and/or another type of dynamic or static storage device (e.g., a flash memory, a magnetic memory, and/or an optical memory) that stores information and/or instructions for use by the processor 820.

The storage component 840 stores information and/or software related to the operation and use of the device 800. For example, the storage component 840 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive. The input component 850 includes a component that permits the device 800 to receive information, such as via user input (e.g., a touch screen display, a keyboard, a keypad, a mouse, a button, a switch, and/or a microphone). Additionally, or alternatively, the input component 850 may include a sensor for sensing information (e.g., a global positioning system (GPS) component, an accelerometer, a gyroscope, an actuator, and/or another type of sensor). The output component 860 may include a component that provides output information from device 800 (e.g., a display, a speaker, and/or one or more light-emitting diodes (LEDs)). The communication interface 870 includes a transceiver-like component (e.g., a transceiver and/or a separate receiver and transmitter) that enables the device 800 to communicate with other devices, such as via a wired connection, a wireless connection, or a combination of wired and wireless connections. The communication interface 870 may permit the device 800 to receive information from another device and/or provide information to another device. For example, the communication interface 870 may include an Ethernet interface, an optical interface, a coaxial interface, an infrared interface, a radio frequency (RF) interface, a universal serial bus (USB) interface, a Wi-Fi interface, a cellular network interface, and/or the like.

The device 800 may perform one or more processes described herein. The device 800 may perform these processes based on the processor 820 executing software instructions stored by a non-transitory computer-readable medium, such as the memory 830 and/or the storage component 840. A computer-readable medium is formed herein as a non-transitory memory device. A memory device may include memory space within a single physical storage device or memory space spread across multiple physical storage devices. Software instructions may be read into the memory 830 and/or the storage component 840 from another computer-readable medium or from another device via the communication interface 870. When executed, software instructions stored in the memory 830 and/or the storage component 840 may cause the processor 820 to perform one or more processes described herein. Additionally, or alternatively, hardwired circuitry may be used in place of or in combination with software instructions to perform one or more processes described herein. Thus, implementations described herein are not limited to any specific combination of hardware circuitry and software. The number and arrangement of the components shown in FIG. 8 are provided as an example. In practice, the device 800 may include additional components, fewer components, different components, or differently arranged components than those shown in FIG. 8. Additionally, or alternatively, a set of components (e.g., one or more components) of device 800 may perform one or more functions described as being performed by another set of components of the device 800.

Figure 9:
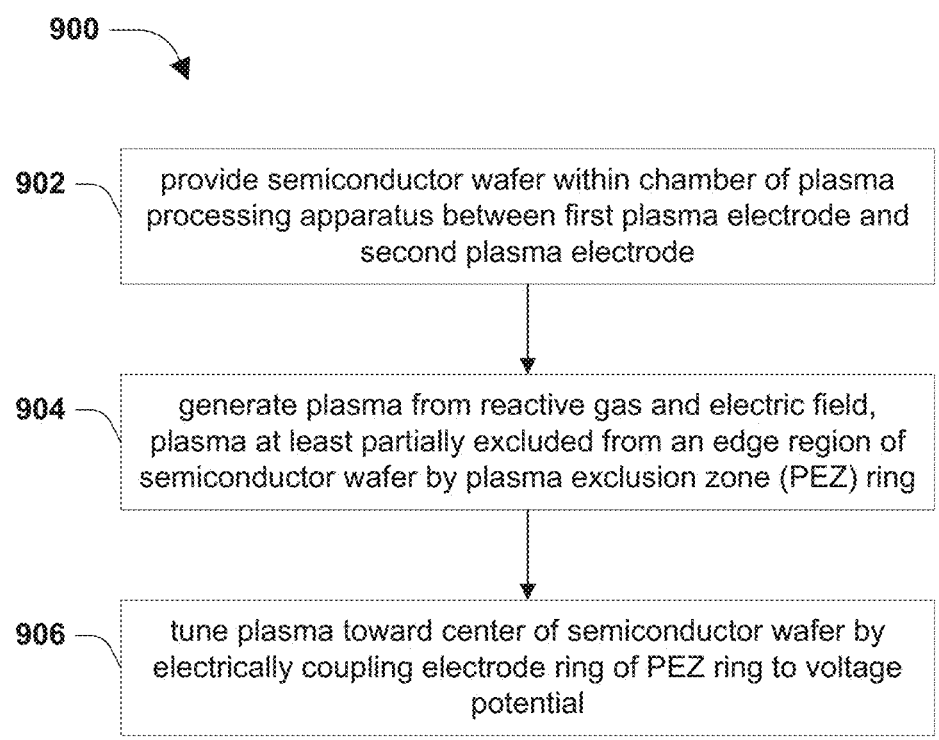
FIG. 9 illustrates an example method, according to some embodiments.

FIG. 9 illustrates an example method 900, according to some embodiments. Some of the operations described can be replaced and/or eliminated for different embodiments. At 902, a semiconductor wafer is provided within a chamber of a plasma processing apparatus between a first plasma electrode and a second plasma electrode. For example and with reference to FIG. 1A, the semiconductor wafer W may be provided within the chamber 104 of the plasma processing apparatus 102 between the first plasma electrode 110 and the second plasma electrode 112. At 904, a plasma is generated from a process gas within the chamber and an electric field between the first plasma electrode and the second plasma electrode. The plasma is at least partially excluded from an edge region of the semiconductor wafer by a plasma exclusion zone (PEZ) ring within the chamber of the plasma processing apparatus. For example and with reference to FIG. 1A, the plasma P may be generated from the process gas 114 within the chamber 104 and the electric field 116 between the first plasma electrode 110 and the second plasma electrode 112. In this example, the plasma P may be at least partially excluded from the edge region 118 of the semiconductor wafer W by the PEZ ring 120 or the second PEZ ring 122 within the chamber 104 of the plasma processing apparatus 102. At 906, the plasma is tuned toward a center of the semiconductor wafer by electrically coupling an electrode ring of the PEZ ring, fastened to a dielectric ring of the PEZ ring, to a voltage potential. In an example and with reference to FIG. 1A, the plasma P may be tuned toward the center of the semiconductor wafer W by electrically coupling the electrode ring 124 or the second electrode ring 126 of the PEZ ring 120, fastened to the dielectric ring 128 of the PEZ ring 120, to a voltage potential provided by the voltage potential unit 145. In an example and with reference to FIG. 1B, the plasma P may be tuned toward the center of the semiconductor wafer W by electrically coupling the third electrode ring 174 or the fourth electrode ring 176 of the second PEZ ring 122, fastened to the second dielectric ring 136 of the second PEZ ring 122, to a voltage potential provided by the power generator 144 of the RF power source 140. Other and/or additional operations of tuning a plasma and/or a plasma exclusion zone in semiconductor fabrication are within the scope of the present disclosure.

According to some embodiments, a method is provided. The method includes providing a semiconductor wafer within a chamber of a plasma processing apparatus between a first plasma electrode and a second plasma electrode. The method includes generating a plasma from a process gas within the chamber and an electric field between the first plasma electrode and the second plasma electrode, the plasma at least partially excluded from an edge region of the semiconductor wafer by a plasma exclusion zone (PEZ) ring within the chamber of the plasma processing apparatus. The method includes tuning the plasma toward a center of the semiconductor wafer by electrically coupling an electrode ring of the PEZ ring, fastened to a dielectric ring of the PEZ ring, to a voltage potential.

According to some embodiments, a plasma exclusion zone ring is provided. A dielectric ring is configured to be removably affixed in a chamber of a plasma processing apparatus a distance from an edge region of a semiconductor wafer in the chamber. The dielectric ring is configured to interact with an electric field that directs a plasma within the chamber toward the edge region. An electrode ring is fastened to the dielectric ring and has an inner electrode ring diameter less than an outer dielectric ring diameter of the dielectric ring. The electrode ring is configured to face the edge region of the semiconductor wafer in the chamber of the plasma processing apparatus and is electrically couplable to a voltage potential to interact with the electric field.

According to some embodiments, a plasma processing apparatus is provided. The plasma processing apparatus includes a stage to support a semiconductor wafer within a chamber between a first plasma electrode and a second plasma electrode. The chamber is configured to receive a process gas that reacts with an electric field generated between the first plasma electrode and the second plasma electrode to create a plasma. A voltage potential unit is configured to supply a voltage potential. A plasma exclusion zone (PEZ) ring is configured to be removably affixed in the chamber a distance from an edge region of the semiconductor wafer. The PEZ ring includes a dielectric ring configured to interact with the electric field and direct the plasma with respect to the edge region of the semiconductor wafer. The PEZ ring includes an electrode ring, fastened to the dielectric ring, electrically couplable to the voltage potential unit to receive the voltage potential and direct the plasma with respect to the edge region of the semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A plasma exclusion zone ring, comprising:
    a dielectric ring configured to be removably affixed in a chamber of a plasma processing apparatus at a distance from an edge region of a semiconductor wafer in the chamber, the dielectric ring configured to interact with an electric field that directs a plasma within the chamber toward the edge region; and
    an electrode ring fastened to the dielectric ring and having an inner electrode ring diameter less than an outer dielectric ring diameter of the dielectric ring, the electrode ring configured to face the edge region of the semiconductor wafer in the chamber of the plasma processing apparatus and being electrically couplable to a voltage potential to interact with the electric field, wherein the inner electrode ring diameter is less than a semiconductor wafer diameter of the semiconductor wafer, and the electrode ring is electrically couplable to the voltage potential to tune the plasma toward a center of the semiconductor wafer.

2. The plasma exclusion zone ring of claim 1, wherein the dielectric ring has a radius greater than or equal to 140 mm and less than or equal to 150 mm.

3. The plasma exclusion zone ring of claim 1, comprising:
a circular spacer configured to be received within a circular groove of the dielectric ring between a body of the dielectric ring and the electrode ring; and
an electrical connector electrically couplable between the electrode ring and the voltage potential by passing through the body of the dielectric ring and the circular spacer.

4. The plasma exclusion zone ring of claim 1, wherein the electrode ring comprises:
a first annular segment fastened to the dielectric ring and electrically coupled to an electrical connector passing through a body of the dielectric ring; and
a second annular segment fastened to the dielectric ring and electrically coupled to a second electrical connector passing through the body of the dielectric ring.

5. The plasma exclusion zone ring of claim 1, comprising:
a second electrode ring fastened to the dielectric ring and having an outer second electrode ring diameter less than the inner electrode ring diameter of the electrode ring, the second electrode ring configured to face the semiconductor wafer in the chamber of the plasma processing apparatus and being electrically couplable to a second voltage potential to interact with the electric field.

6. The plasma exclusion zone ring of claim 1, comprising a circular spacer disposed vertically between the dielectric ring and the electrode ring.

7. The plasma exclusion zone ring of claim 6, comprising a circular groove disposed between the dielectric ring and the electrode ring and between the dielectric ring and the circular spacer.

8. A plasma processing apparatus, comprising:
a stage to support a semiconductor wafer within a chamber between a first plasma electrode and a second plasma electrode, the chamber configured to receive a process gas that reacts with an electric field generated between the first plasma electrode and the second plasma electrode to create a plasma;
a voltage potential unit to supply a voltage potential; and
a plasma exclusion zone (PEZ) ring configured to be removably affixed in the chamber a distance from an edge region of the semiconductor wafer, the PEZ ring comprising:
a dielectric ring configured to interact with the electric field and direct the plasma with respect to the edge region of the semiconductor wafer, wherein the first plasma electrode surrounds three sides of the dielectric ring such that a sidewall of the dielectric ring at an outer circumference of the dielectric ring faces a sidewall of the first plasma electrode; and
an electrode ring, fastened to the dielectric ring, electrically couplable to the voltage potential unit to receive the voltage potential and direct the plasma with respect to the edge region of the semiconductor wafer.

9. The plasma processing apparatus of claim 8, wherein the first plasma electrode is coupled to ground, and
the voltage potential supplied by the voltage potential unit is at least one of ground or a bias voltage to direct the plasma to deposit a dielectric material on the edge region of the semiconductor wafer.

10. The plasma processing apparatus of claim 8, wherein the PEZ ring comprises:
a second electrode ring, fastened to the dielectric ring, electrically couplable to the voltage potential unit to receive the voltage potential and direct the plasma toward a center of the semiconductor wafer.

11. The plasma processing apparatus of claim 8, comprising:
a radio frequency (RF) power source coupled to at least one of the first plasma electrode or the second plasma electrode to generate the electric field;
a switch unit to selectively couple the voltage potential unit to the electrode ring; and
a controller to control the switch unit to couple the voltage potential unit to the electrode ring.

12. A plasma processing apparatus, comprising:
a first plasma electrode;
a second plasma electrode;
a radio frequency power source configured to provide an electric field between the first plasma electrode and the second plasma electrode to generate a plasma; and
a first plasma exclusion zone (PEZ) ring configured to interact with the electric field to cause the plasma to be at least partially excluded from an edge region of a semiconductor wafer when the semiconductor wafer is disposed between the first plasma electrode and the second plasma electrode, wherein the first PEZ ring comprises:
a first electrode ring having a first cross-sectional profile; and
a second electrode ring spaced apart from the first electrode ring by a portion of a dielectric ring, wherein:
the second electrode ring has a second cross-sectional profile, and
the second cross-sectional profile is different than the first cross-sectional profile.

13. The plasma processing apparatus of claim 12, wherein the plasma is tuned toward a center of the semiconductor wafer using at least one of the first electrode ring or the second electrode ring.

14. The plasma processing apparatus of claim 12, wherein the first electrode ring and the second electrode ring each has an inner electrode ring diameter less than an outer PEZ ring diameter of the first PEZ ring.

15. The plasma processing apparatus of claim 12, wherein the first PEZ ring comprises:
a dielectric ring coupled to the first electrode ring and the second electrode ring.

16. The plasma processing apparatus of claim 12, wherein:
the first PEZ ring is disposed adjacent the first plasma electrode, and
the plasma processing apparatus comprises a second PEZ ring adjacent the second plasma electrode.

17. The plasma processing apparatus of claim 12, wherein:
at least one of the first electrode ring or the second electrode ring comprises a first annular segment and a second annular segment than together at least partially define a ring, and
the first annular segment is separated from the second annular segment.

18. The plasma processing apparatus of claim 17, wherein:
the first PEZ ring comprises a dielectric ring, and
a portion of the dielectric ring is disposed between the first annular segment and the second annular segment.

19. The plasma processing apparatus of claim 12, wherein the first PEZ ring comprises:
- a dielectric ring; and
- a circular spacer received within a circular groove of the dielectric ring vertically between a body of the dielectric ring and at least one of the first electrode ring or the second electrode ring.

20. The plasma processing apparatus of claim 19, wherein the first PEZ ring comprises:
- an electrical connector electrically couplable between the at least one of the first electrode ring or the second electrode ring and a voltage potential to which the at least one of the first electrode ring or the second electrode ring is coupled by passing through the body of the dielectric ring and the circular spacer.

* * * * *